US009905437B2

(12) United States Patent
Terasaki et al.

(10) Patent No.: US 9,905,437 B2
(45) Date of Patent: Feb. 27, 2018

(54) METHOD OF PRODUCING BONDED BODY AND METHOD OF PRODUCING POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/910,110

(22) PCT Filed: Aug. 18, 2014

(86) PCT No.: PCT/JP2014/071528
§ 371 (c)(1),
(2) Date: Feb. 4, 2016

(87) PCT Pub. No.: WO2015/029813
PCT Pub. Date: Mar. 5, 2015

(65) Prior Publication Data
US 2016/0181123 A1    Jun. 23, 2016

(30) Foreign Application Priority Data
Aug. 26, 2013    (JP) .................................. 2013-175003

(51) Int. Cl.
*B23K 1/00* (2006.01)
*H01L 21/48* (2006.01)
(Continued)

(52) U.S. Cl.
CPC ........ *H01L 21/4846* (2013.01); *B23K 1/0016* (2013.01); *B23K 35/0222* (2013.01);
(Continued)

(58) Field of Classification Search
CPC ...... B23K 35/302; B23K 1/0016; B23K 1/19; B23K 2201/36; B23K 35/001; B23K 35/0222; B23K 35/0233
(Continued)

(56) References Cited

U.S. PATENT DOCUMENTS 3,382,052 A * 5/1968 Clarke ................. B23K 35/001
228/124.5
4,460,658 A    7/1984 Bose et al.
(Continued)

FOREIGN PATENT DOCUMENTS

EP    0 930 282 A1    7/1999
EP    2978018 A1    1/2016
(Continued)

OTHER PUBLICATIONS

JP 2006041231 A computer english translation.*
(Continued)

*Primary Examiner* — Erin B Saad
(74) *Attorney, Agent, or Firm* — Locke Lord LLP; James E. Armstrong, IV; Nicholas J. DiCeglie, Jr.

(57) ABSTRACT

A method of producing a bonded body is disclosed in which a ceramic member made of ceramics and a Cu member made of Cu or a Cu alloy are bonded to each other, the method including: a laminating step of laminating the ceramic member and the Cu member in a state where a Cu—P-based brazing filler material containing 3 mass % to 10 mass % of P and an active metal material are interposed therebetween; and a heating step of heating the ceramic member and the Cu member which are laminated.

19 Claims, 13 Drawing Sheets

(51) Int. Cl.
- *B23K 35/30* (2006.01)
- *C22C 9/00* (2006.01)
- *C22C 9/02* (2006.01)
- *H01L 23/373* (2006.01)
- *B23K 35/362* (2006.01)
- *C22C 9/06* (2006.01)
- *B23K 35/02* (2006.01)

(52) U.S. Cl.
CPC ...... *B23K 35/0233* (2013.01); *B23K 35/0238* (2013.01); *B23K 35/30* (2013.01); *B23K 35/302* (2013.01); *B23K 35/362* (2013.01); *C22C 9/00* (2013.01); *C22C 9/02* (2013.01); *C22C 9/06* (2013.01); *H01L 23/3735* (2013.01); *C04B 2237/12* (2013.01); *C04B 2237/124* (2013.01); *C04B 2237/32* (2013.01); *C04B 2237/366* (2013.01); *C04B 2237/368* (2013.01); *C04B 2237/40* (2013.01); *C04B 2237/402* (2013.01); *C04B 2237/407* (2013.01); *H01L 2224/32225* (2013.01); *H01L 2924/0002* (2013.01)

(58) Field of Classification Search
USPC ........... 228/124.1, 262.61, 124.5, 256, 262.6
See application file for complete search history.

(56) References Cited

U.S. PATENT DOCUMENTS

| | | | | |
|---|---|---|---|---|
| 4,659,245 A | * | 4/1987 | Hirao | ............... F01D 5/025 403/272 |
| 5,378,294 A | | 1/1995 | Rissanen | |
| 6,232,657 B1 | | 5/2001 | Komorita et al. | |
| 6,261,703 B1 | | 7/2001 | Sasaki et al. | |
| 8,448,842 B1 | * | 5/2013 | Wu | ...................... B23K 20/021 205/163 |
| 2005/0249629 A1 | * | 11/2005 | Harris | ................. B23K 35/302 420/472 |
| 2008/0315401 A1 | | 12/2008 | Imamura et al. | |
| 2009/0283309 A1 | | 11/2009 | Naba et al. | |
| 2011/0272187 A1 | | 11/2011 | Kaga et al. | |

FOREIGN PATENT DOCUMENTS

| | | | |
|---|---|---|---|
| EP | 2978019 A1 | | 1/2016 |
| JP | 04-295065 A | | 10/1992 |
| JP | H06-120634 A | | 4/1994 |
| JP | H09-70686 A | | 3/1997 |
| JP | 10-286666 A | | 10/1998 |
| JP | 2001-085571 A | | 3/2001 |
| JP | 2006041231 A | * | 2/2006 |
| JP | 2006-229247 A | | 8/2006 |
| JP | 4375730 B2 | | 12/2009 |
| JP | 2013-098387 A | | 5/2013 |
| KR | 10-1231550 B1 | | 2/2013 |
| WO | WO-2013/024813 A1 | | 2/2013 |

OTHER PUBLICATIONS

International Search Report dated Nov. 18, 2014, issued for PCT/JP2014/071528 and English translation thereof.
Notice of Allowance issued in corresponding Japanese Patent Application No. JP 2013-175003, dated Mar. 14, 2017.
Extended European Search Report, issued in corresponding European Patent Application No. EP 14839742.5, dated Feb. 24, 2017.
Office Action (part of Search Report) issued in corresponding Taiwanese Patent Application No. TW 103128295, dated Nov. 9, 2017.
Office Action (Communication) issued in corresponding European Patent Application No. EP 14839742.5, dated Nov. 14, 2017.

* cited by examiner

METHOD OF PRODUCING BONDED BODY AND METHOD OF PRODUCING POWER MODULE SUBSTRATE

TECHNICAL FIELD

The invention relates to a method of producing a bonded body in which a ceramic member is bonded to a Cu member, and a method of producing a power module substrate in which a circuit layer made of Cu or a Cu alloy is provided on one surface of a ceramic substrate.

Priority is claimed on Japanese Patent Application No. 2013-175003, filed Aug. 26, 2013, the content of which is incorporated herein by reference.

BACKGROUND ART

Semiconductor devices such as an LED and a power module have a structure in which semiconductor elements are bonded to an upper surface of a circuit layer made of a conductive material.

A high-power control power semiconductor element used to control wind power generation systems and electric vehicles such as electric automobiles radiates a large amount of heat. For this reason, in the related art, a power module substrate, in which a metal plate with superior electrical conductivity as a circuit layer is bonded to one surface of a ceramic substrate made of aluminum nitride (AlN) or the like, is widely used as a substrate on which such power semiconductor elements are mounted. In another type of power module substrate, a metal plate as a metal layer may be bonded to the other surface of the ceramic substrate.

A power module substrate disclosed in PTL 1 has a structure in which a circuit layer is formed by bonding a Cu foil (Cu member) to one surface of a ceramic substrate (ceramic member). The power module substrate is formed by bonding the Cu foil to the ceramic substrate through the heating of the Cu foil which is disposed on the one surface of the ceramic substrate with a Cu—Mg—Ti brazing filler material interposed between the Cu foil and the ceramic substrate.

CITATION LIST

Patent Literature

[PTL 1] Japanese Patent No. 4375730

SUMMARY OF INVENTION

Technical Problem

As disclosed in PTL 1, when the circuit layer is formed by bonding the ceramic substrate to the Cu foil through the Cu—Mg—Ti brazing filler material, a thick intermetallic compound layer containing Cu, Mg, or Ti is formed at the bonded interface between the ceramic substrate and the brazing filler material.

Since the intermetallic compound layer formed at the bonded interface between the ceramic substrate and the brazing filler material is rigid, the bonding rate between the ceramic substrate and the circuit layer is decreased, and the ceramic substrate and the circuit layer cannot be sufficiently bonded to each other, which is a problem.

The invention is made in light of these problems, and an object of the invention is to provide a method of producing a bonded body and a method of producing a power module substrate in which a ceramic member and a Cu member can be sufficiently bonded to each other.

Solution to Problem

According to a first aspect of the present invention, in order to solve these problems, a method of producing a bonded body is provided in which a ceramic member made of ceramics and a Cu member made of Cu or a Cu alloy are bonded to each other, the method including: a laminating step of laminating the ceramic member and the Cu member in a state where a Cu—P-based brazing filler material containing 3 mass % to 10 mass % of P and an active metal material are interposed between the Cu member and the ceramic member; and a heating step of heating the ceramic member and the Cu member which are laminated.

The method of producing a bonded body according to the first aspect of the present invention includes the laminating step of laminating the Cu member on the ceramic member in a state where the Cu—P-based brazing filler material containing 3 mass % to 10 mass % of P and the active metal material are interposed therebetween; and the heating step of heating the ceramic member and the Cu member which are laminated. Therefore, in the heating step, P contained in the Cu—P-based brazing filler material is combined with an active element contained in the active metal material such that an intermetallic compound containing P is formed, and P is drawn into the intermetallic compound. As a result, a Cu layer is formed close to the ceramic member. In this case, a rigid intermetallic compound layer is not formed at the bonded interface between the ceramic member and the Cu layer, and thus the bonding rate between the ceramic member and the Cu member is improved, and the ceramic member and the Cu member can be sufficiently bonded to each other.

Since the Cu—P brazing filler material containing 3 mass % to 10 mass % of P has a low melting point, the ceramic member and the Cu member can be bonded to each other at a relatively low temperature. As a result, it is possible to reduce the thermal load applied to the ceramic member during bonding.

The active metal material contains one or more of active elements such as Ti, Zr, Nb, and Hf. The active metal material has a foil shape, is in the form of a powder, or the like.

Preferably, the Cu—P-based brazing filler material is disposed close to the ceramic member, and the active metal material is disposed close to the Cu member.

In this configuration, the Cu member and the active metal material are heated, and thereby the Cu member and the active metal material can be bonded to each other through diffusion in solids. Accordingly, the melted liquid of the Cu—P-based brazing filler material is solidified, and thereby the ceramic member and the Cu member can be reliably bonded to each other.

Preferably, the Cu—P-based brazing filler material is any one selected from a Cu—P brazing filler material, a Cu—P—Sn brazing filler material, a Cu—P—Sn—Ni brazing filler material, and a Cu—P—Zn brazing filler material.

When such a brazing filler material is used, the melting point of the brazing material is low, and thus the ceramic member and the Cu member can be reliably bonded to each other even at a low temperature. When the ceramic member and the Cu member are bonded to each other, P and the like contained in the brazing filler material are combined with the element contained in the active metal material, and thereby an intermetallic compound is formed. Therefore, a Cu layer without an intermetallic compound containing P or with a very small amount of an intermetallic compound containing P can be reliably formed close to the ceramic member.

In the above-mentioned method of producing a bonded body, preferably, the active metal material contains Ti.

In this case, in the heating step, Ti is combined with P contained in the Cu—P-based brazing filler material such that an intermetallic compound containing P and Ti is formed, and P is drawn into the intermetallic compound. As a result, a Cu layer is reliably formed close to the ceramic member. Accordingly, it is possible to reliably limit the formation of a rigid intermetallic compound layer at the bonded interface between the ceramic member and the Cu layer. As a result, the bonding rate between the ceramic member and the Cu member can be improved, and the ceramic member and the Cu member can be sufficiently bonded to each other.

According to a second aspect of the present invention, a method of producing a power module substrate is provided in which a circuit layer made of Cu or a Cu alloy is provided on a first surface of a ceramic substrate, in which the ceramic substrate and the circuit layer are bonded to each other by the above-mentioned method of producing a bonded body.

According to the method of producing a power module substrate in the second aspect of the present invention, in the heating step, the active metal material is combined with P such that an intermetallic compound containing P is formed, and P is drawn into the intermetallic compound. As a result, a Cu layer is formed close to the ceramic substrate. In this case, a rigid intermetallic compound layer is not formed at the bonded interface between the ceramic substrate and the Cu layer, and thus the bonding rate between the ceramic substrate and the circuit layer is improved, and the ceramic substrate and the circuit layer can be sufficiently bonded to each other.

Since the melting point of the Cu—P-based brazing filler material is low, and the circuit layer is formed on the first surface of the ceramic substrate at a relatively low temperature, it is possible to limit the thermal degradation of the ceramic substrate during the formation of the circuit layer.

According to a third aspect of the present invention, a method of producing a power module substrate is provided in which a circuit layer made of Cu or a Cu alloy is provided on a first surface of a ceramic substrate, and a metal layer made of Cu or a Cu alloy is provided on a second surface of the ceramic substrate, in which the ceramic substrate and the circuit layer are bonded to each other, and the ceramic substrate and the metal layer are bonded to each other by the above-mentioned method of producing a bonded body.

In this configuration, an active metal material is combined with P contained in a Cu—P-based brazing filler material such that an intermetallic compound containing P is formed in each of the first surface and the second surface of the ceramic substrate. As a result, a Cu layer is formed, and a rigid intermetallic compound layer is not formed at the bonded interface between the ceramic substrate and the Cu layer. Therefore, the bonding rate between the ceramic substrate and the circuit layer is improved, and the ceramic substrate and the circuit layer can be sufficiently bonded to each other. The bonding rate between the ceramic substrate and the metal layer is improved, and the ceramic substrate and the metal layer can be sufficiently bonded to each other.

Since the circuit layer and the metal layer can be respectively formed on the first surface and the second surface of the ceramic substrate at a relatively low temperature, it is possible to limit the thermal degradation of the ceramic substrate.

According to the method of producing a power module substrate, the circuit layer and the metal layer can be respectively formed on the first surface and the second surface of the ceramic substrate simultaneously. As a result, it is possible to reduce the thermal load applied to the ceramic substrate, and to reduce producing costs.

According to a fourth aspect of the present invention, a method of producing a power module substrate is provided in which a circuit layer made of Cu or a Cu alloy is provided on a first surface of a ceramic substrate, and a metal layer made of Al or an Al alloy is provided on a second surface of the ceramic substrate, in which the ceramic substrate and the circuit layer are bonded to each other by the above-mentioned method of producing a bonded body.

Since the circuit layer and the metal layer can be respectively formed on the first surface and the second surface of the ceramic substrate at a relatively low temperature, it is possible to limit the thermal degradation of the ceramic substrate.

According to the method of producing a power module substrate in the fourth aspect of the present invention, the circuit layer and the metal layer can be respectively formed on the first surface and the second surface of the ceramic substrate simultaneously. As a result, it is possible to reduce the thermal load applied to the ceramic substrate, and to reduce producing costs.

Advantageous Effects of Invention

According to the present invention, it is possible to provide a method of producing a bonded body and a method of producing a power module substrate in which a ceramic member and a Cu member can be sufficiently bonded to each other.

DESCRIPTION OF EMBODIMENTS

First Embodiment

Hereinafter, embodiments of the present invention will be described with reference to the accompanying drawings. First, a first embodiment of the present invention will be described.

Figure 1:
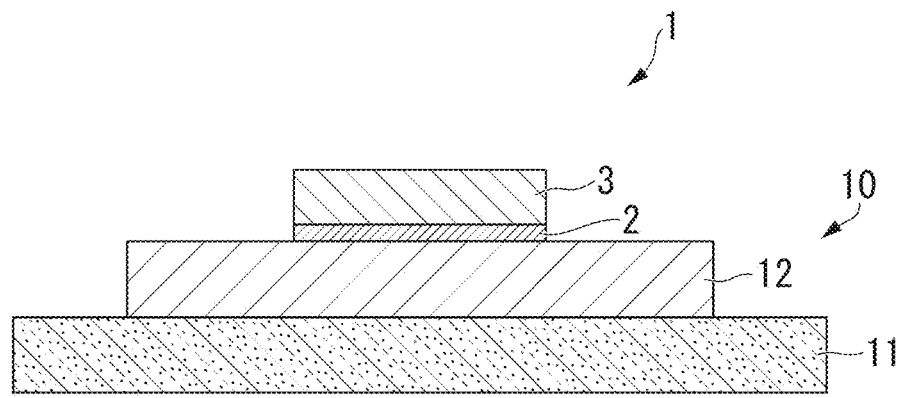
FIG. 1 is a schematic view of a power module in which a power module substrate is used in a first embodiment of the present invention.

According a method of producing a bonded body in the embodiment, a power module substrate 10 as the bonded body is produced by bonding a ceramic substrate 11 (ceramic member) to a circuit layer 12 (Cu member). FIG. 1 shows a power module 1 including the power module substrate 10 in the embodiment.

The power module 1 includes the power module substrate 10 on which the circuit layer 12 is provided, and a semiconductor element 3 that is bonded to one surface (an upper surface in FIG. 1) of the circuit layer 12 through a bonding layer 2.

Figure 2:
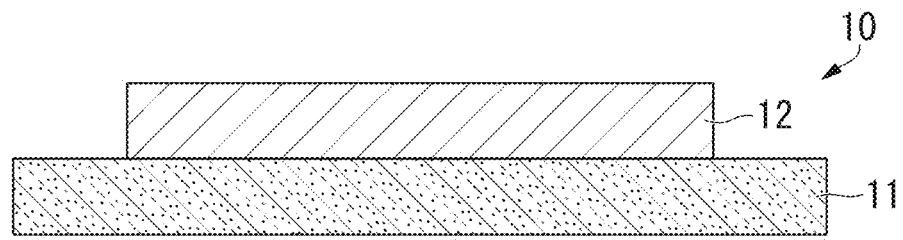
FIG. 2 is a schematic view of the power module substrate in the first embodiment of the present invention.

As shown in FIG. 2, the power module substrate 10 includes the ceramic substrate 11 including a first surface and a second surface, and the circuit layer 12 that is provided on the first surface (an upper surface in FIG. 2) which is one surface of the ceramic substrate 11.

The ceramic substrate 11 is made of high-insulation ceramics such as aluminum nitride (AlN), silicon nitride ($Si_3N_4$), and alumina ($Al_2O_3$). In the embodiment, the ceramic substrate 11 is made of aluminum nitride (AlN) having good heat radiation. The thickness of the ceramic substrate 11 is set to a range of 0.2 mm to 1.5 mm. In the embodiment, the thickness is set to 0.635 mm.

The circuit layer 12 is formed by bonding an electrically-conductive metal plate (Cu foil 22) made of Cu or a Cu alloy to the first surface of the ceramic substrate 11 through an active metal material and a Cu—P-based brazing filler material. The Cu foil 22 may be made of oxygen-free copper, deoxidized copper, tough pitch copper, or the like. In the embodiment, the Cu foil 22 is made of oxygen-free copper. The thickness of the Cu foil 22 is set to a range of 0.1 mm to 1.0 mm. In the embodiment, the thickness is set to 0.6 mm.

In the embodiment, a P content of the Cu—P-based brazing filler material is 3 mass % to 10 mass %. Hereinafter, the reason the P content is set to 3 mass % to 10 mass % will be described.

(P: 3 Mass % to 10 Mass %)

P is an element having an effect of lowering the melting point of a brazing filler material. P is an element having an effect of preventing the oxidation of the brazing filler material by coating the surface of the brazing filler material with phosphorous oxide produced by the oxidation of P, and an effect of improving the wettability of the brazing filler material by covering the surface of the melted brazing filler material with phosphorous oxide with good fluidity.

When the P content is less than 3 mass %, there is a concern that the effect of sufficiently lowering the melting point of the brazing filler material cannot be obtained, and thus the melting point of the brazing filler material is increased, and the fluidity of the brazing filler material is low. Therefore, bondability between the ceramic substrate 11 and the circuit layer 12 is not sufficiently secured, which is a problem. When the P content exceeds 10 mass %, a large amount of brittle intermetallic components are formed, and the bondability and reliability of the bond between the ceramic substrate 11 and the circuit layer 12 are not sufficiently secured, which is a problem.

For this reason, the P content of the Cu—P-based brazing filler material is set to a range of 3 mass % to 10 mass %. The P content is more preferably set to a range of 6 mass % to 9 mass %.

The Cu—P-based brazing filler material may contain 0.5 mass % to 25 mass % of Sn. The Cu—P-based brazing filler material may contain a total of 2 mass % to 20 mass % of one or more of Ni, Cr, Fe, and Mn. The Cu—P-based brazing filler material may contain 0.5 mass % to 50 mass % of Zn. Hereinafter, when the Cu—P brazing filler material contains these elements, the reason for setting the amount of each element to the aforementioned range will be described.

(Sn: 0.5 Mass % to 25 Mass %)

Sn is an element having an effect of lowering the melting point of a brazing filler material.

When the Sn content is 0.5 mass % or more, the melting point of the brazing filler material can be reliably lowered. When the Sn content is less than or equal to 25 mass % or less, embrittlement of the brazing filler material at a low temperature can be limited, and the reliability of the bond between the ceramic substrate and the circuit layer can be improved.

For this reason, when the Cu—P-based brazing filler material contains Sn, the Sn content is set to a range of 0.5 mass % to 25 mass %.

(Ni, Cr, Fe, and Mn: 2 Mass % to 20 Mass %)

Ni, Cr, Fe, and Mn are elements having an effect of limiting the formation of an intermetallic compound containing P at the interface between the ceramic substrate 11 and the brazing filler material.

When the total amount of one or more of Ni, Cr, Fe, and Mn is 2 mass % or more, the formation of an intermetallic compound containing P at the interface between the ceramic substrate 11 and the brazing filler material can be limited, and the reliability of the bond between the ceramic substrate 11 and the circuit layer 12 is improved. When the total amount of one or more of Ni. Cr, Fe, and Mn is 20 mass % or less, an increase in the melting point of the brazing filler material can be limited, and a decrease in the fluidity of the brazing filler material can be limited. As a result, bondability between the ceramic substrate 11 and the circuit layer 12 can be improved.

For this reason, when the Cu—P-based brazing filler material contains one or more of Ni, Cr, Fe, and Mn, the total content of these elements is set to a range of 2 mass % to 20 mass %.

(Zn: 0.5 Mass % to 50 Mass %)

Zn is an element having an effect of improving the resistance of the brazing filler material to oxidation.

When the Zn content is 0.5 mass % or more, the resistance of the brazing filler material to oxidation can be sufficiently secured, and bondability can be improved. When the Zn content is 50 mass % or less, the formation of a large amount of brittle intermetallic compounds can be prevented, and the reliability of the bond between the ceramic substrate 1 and the circuit layer 12 can be secured.

For this reason, when the Cu—P-based brazing filler material contains Zn, the Zn content is set to a range of 0.5 mass % to 50 mass %.

Specific examples of the Cu—P-based brazing filler material include a Cu—P brazing filler material, a Cu—P—Sn-based brazing filler material, a Cu—P—Sn—Ni-based brazing filler material, a Cu—P—Zn-based brazing filler material, a Cu—P—Sn—Mn-based brazing filler material, a Cu—P—Sn—Cr-based brazing filler material, and a Cu—P—Sn—Fe-based brazing filler material. In the embodiment, a Cu—P—Sn—Ni brazing filler material 24 is used.

In the embodiment, the specific compositions of the Cu—P—Sn—Ni brazing filler material 24 are Cu, 7 mass % of P, 15 mass % of Sn, and 10 mass % of Ni. The Cu—P—Sn—Ni brazing filler material 24 has a foil shape, and the thickness thereof is in a range of 5 µm to 150 µm.

The active metal material contains one or more of active elements such as Ti, Zr, Nb, and Hf. The active metal material has a foil shape, is in the form of a powder, or the like.

In the first embodiment, Ti foil 25 is used as the active metal material, and the thickness of the Ti foil 25 is in a range of 6 µm to 25 µm. The purity of the Ti foil 25 may be 99.4% or more. In the embodiment, Ti foil with a purity of 99.8% is used.

Figure 5:
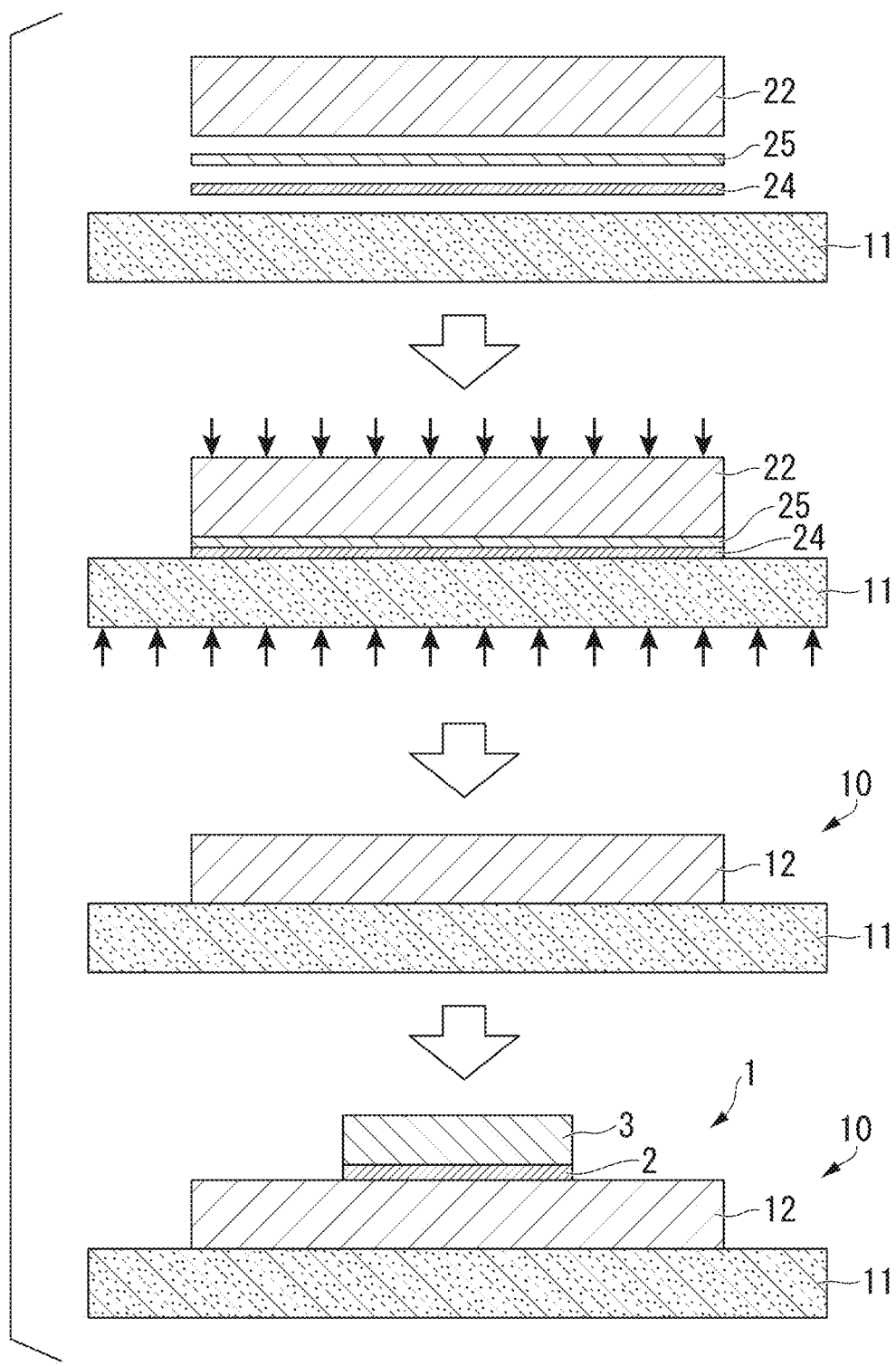
FIG. 5 shows views showing the method of producing the power module substrate and the power module in the first embodiment of the present invention.

That is, in the first embodiment, the circuit layer 12 is formed by bonding the Cu foil 22 to the ceramic substrate 11 through the heating of the Cu—P—Sn—Ni brazing filler material 24, the Ti foil 25, and the Cu foil 22 made of oxygen-free copper which are sequentially laminated on the first surface of the ceramic substrate 11 (refer to FIG. 5).

The thickness of the circuit layer 12 is set to a range of 0.1 mm to 1.0 mm. In the embodiment, the thickness is set to 0.6 mm.

Figure 3:
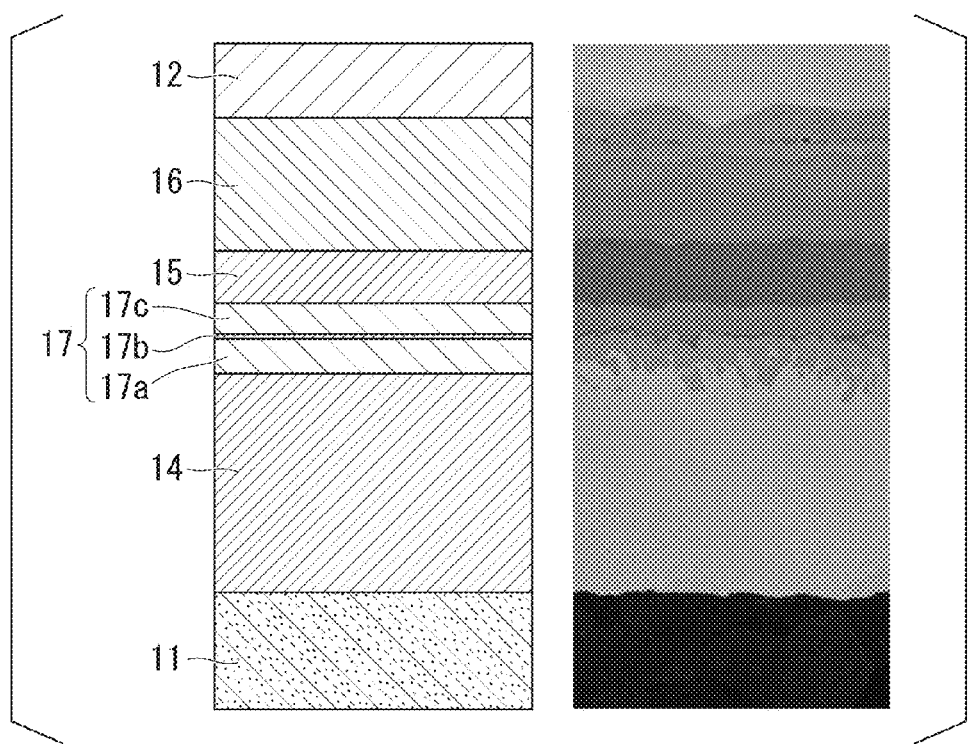
FIG. 3 is an electron micrograph obtained by capturing an image of the section of the bonded interface between a circuit layer and a ceramic substrate shown in FIG. 2, and a schematic view thereof.

FIG. 3 shows an electron micrograph of the bonded interface between the ceramic substrate 11 and the circuit layer 12, and a schematic view thereof. As shown in FIG. 3, a Cu—Sn layer (Cu layer) 14 and a Ti layer 15 are formed at the bonded interface between the ceramic substrate 11 and the circuit layer 12. The Cu—Sn layer 14 is positioned close to the ceramic substrate 11, and the Ti layer 15 is positioned between the circuit layer 12 and the Cu—Sn layer 14.

A first intermetallic compound layer 16 made of Cu and Ti is formed between the circuit layer 12 and the Ti layer 15. A second intermetallic compound layer 17 containing P and Ni is formed between the Cu—Sn layer 14 and the Ti layer 15.

The Cu—Sn layer 14 is a layer in which Sn forms a solid solution with Cu. P and Ni contained in the Cu—P—Sn—Ni brazing filler material 24 are drawn into the second intermetallic compound layer 17 formed close to the Ti layer 15 such that the Cu—Sn layer 14 is formed.

As described above, the Ti layer 15 is formed by bonding the ceramic substrate 11 and the Cu foil 22 to each other through the Cu—P—Sn—Ni brazing filler material 24 and the Ti foil 25.

Cu in the circuit layer 12 diffuses through the Ti layer 15 and Ti in the Ti layer 15 diffuses through the circuit layer 12. Thereby, the first intermetallic compound layer 16 is formed. Here, Cu and Ti diffuse in solids.

P and Ni contained in the Cu—P—Sn—Ni brazing filler material 24 are combined with Ti contained in the Ti foil 25, and thereby the second intermetallic compound layer 17 is formed. In the embodiment, as shown in FIG. 3, the second intermetallic compound layer 17 includes a P—Ni—Ti layer 17a, a P—Ti layer 17b, and a Cu—Ni—Ti layer 17c which are formed in this order from the Cu—Sn layer 14.

The semiconductor element 3 is made of a semiconductor material such as Si. The semiconductor element 3 and the circuit layer 12 are bonded to each other through the bonding layer 2.

The bonding layer 2 is made of a Sn—Ag-based solder material, a Sn—In-based solder material, a Sn—Ag—Cu-based solder material, or the like.

Figure 4:
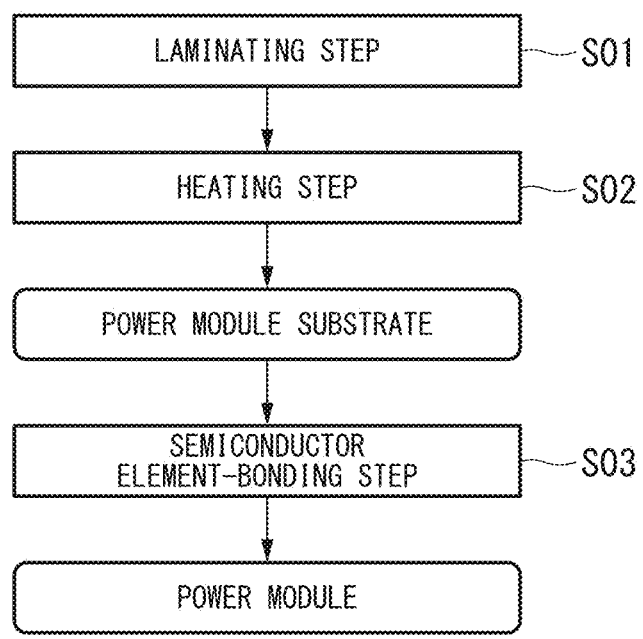
FIG. 4 is a flowchart showing a method of producing the power module substrate and the power module in the first embodiment of the present invention.

Hereinafter, a method of producing the power module substrate 10 and the power module 1 in the embodiment will be described with reference to the flowchart in FIG. 4, and FIG. 5.

First, as shown in FIG. 5, the Cu—P—Sn—Ni brazing filler material 24, the Ti foil 25, and the Cu foil 22 (the circuit layer 12) are sequentially laminated on the first surface (an upper surface in FIG. 5) which is one surface of the ceramic substrate 11 (laminating step S01). That is, between the ceramic substrate 11 and the Cu foil 22, the Cu—P—Sn—Ni brazing filler material 24 is disposed close to the ceramic substrate 11, and the Ti foil 25 is disposed close to the Cu foil 22.

In the embodiment, the Cu—P—Sn—Ni brazing filler material 24 with a thickness of 20 µm, and the Ti foil 25 with a thickness of 7 µm and a purity of 99.8% are used.

Subsequently, the ceramic substrate 11, the Cu—P—Sn—Ni brazing filler material 24, the Ti foil 25, and the Cu foil 22 are placed into and heated in a vacuum heating furnace while being pressurized (at a pressure of 1 kgf/cm² to 35 kgf/cm² (0.10 MPa to 3.43 MPa)) in a laminating direction (heating step S02). In the embodiment, the internal pressure of the vacuum heating furnace is set to a range of $10^{-6}$ Pa to $10^{-3}$ Pa, the heating temperature is set to a range of 600° C. to 650° C., and the heating time is set to a range of 30 minutes to 360 minutes.

In the heating step S02, the Ti foil 25 and the Cu foil 22 are bonded to each other through diffusion in solids, the Cu—P—Sn—Ni brazing filler material 24 is melted to form a liquid phase, and the liquid phase is solidified. Thereby, the ceramic substrate 11 and the Ti foil 25 are bonded to each other. At this time, the first intermetallic compound layer 16 made of Ti and Cu is formed at the bonded interface between the Cu foil 22 (the circuit layer 12) and the Ti foil 25 (the Ti layer 15). P and Ni contained in the Cu—P—Sn—Ni brazing filler material 24 are combined with Ti in the Ti foil 25. Thereby, the second intermetallic compound layer 17 is formed, and the Cu—Sn layer 14 not containing P and Ni or containing a very small amount of P and Ni is formed close to the ceramic substrate 11. Bonded surfaces of the Ti foil 25 and the Cu foil 22, which are bonded to each other through diffusion in solids, are previously smooth surfaces.

As a result, the circuit layer 12 is formed on the first surface of the ceramic substrate 11 such that the power module substrate 10 in the embodiment is produced.

Subsequently, the semiconductor element 3 is bonded to the upper surface of the circuit layer 12 of the power module substrate 10 through a solder material (semiconductor element-bonding step S03).

As such, the power module 1 in the embodiment is produced.

The method of producing the power module substrate 10 with such a configuration according to the embodiment includes the laminating step S01 of laminating the Cu foil 22 on the ceramic substrate 11 with the Ti foil 25 (active metal material) and the Cu—Sn—Ni—P brazing filler material 24 (Cu—P-based brazing filler material) being interposed therebetween, and the heating step S02 of heating the ceramic substrate 11 and the Cu foil 22 laminated. For this reason, in the heating step S02, the Ti foil 25 is combined with P and Ni contained in the Cu—Sn—Ni—P brazing filler material 24 such that the second intermetallic compound layer 17 is formed close to the circuit layer 12, and P is drawn into the second intermetallic compound layer 17. As a result, the Cu—Sn layer 14 (Cu layer) is formed close to the ceramic substrate 11. That is, since a rigid intermetallic compound layer is not formed at the bonded interface between the ceramic substrate 11 and the Cu—Sn layer 14, the bonding rate between the ceramic substrate 11 and the circuit layer 12 is improved, and the ceramic substrate 11 and the circuit layer 12 can be sufficiently bonded to each other.

The ceramic substrate 11 and the circuit layer 12 are bonded to each other through the Cu—Sn—Ni—P brazing filler material 24. Since the Cu—Sn—Ni—P brazing filler material 24 has a low melting point, the ceramic substrate 11 and the circuit layer 12 can be bonded to each other at a relatively low temperature. As a result, it is possible to reduce the thermal load applied to the ceramic substrate 11 during bonding.

When the heating temperature is 600° C. or higher in the heating step S02, it is possible to reliably melt the Cu—P—Sn—Ni brazing filler material 24 at the bonded interface between the ceramic substrate 11 and the Cu foil 22. Since the Ti foil 25 and the Cu foil 22 can be sufficiently bonded to each other through diffusion in solids, the ceramic substrate 11 and the Cu foil 22 can be reliably bonded to each other. When the heating temperature is 650° C. or less, it is possible to limit thermal degradation of the ceramic substrate 11. In addition, it is possible to reduce thermal stress generating in the ceramic substrate 11. For this reason, in the embodiment, the heating temperature is set to a range of 600° C. to 650° C. The heating temperature may be set to a range of 630° C. to 650° C.

When pressure applied to the ceramic substrate 11 and the like laminated is 1 kgf/cm$^2$ (0.10 MPa) or greater in the heating step S02, since the ceramic substrate 11 is capable of coming into close contact with the liquid phase of the Cu—P—Sn—Ni brazing filler material 24, the ceramic substrate 11 and the Cu—Sn layer 14 can be sufficiently bonded to each other. When the applied pressure is 1 kgf/cm$^2$ or greater, the occurrence of a gap being generated between the Ti foil 25 and the Cu foil 22 can be limited, and the Ti foil 25 and the Cu foil 22 can be bonded to each other through diffusion in solids. When the applied pressure is 35 kgf/cm$^2$ (3.43 MPa) or less, it is possible to limit the occurrence of cracking in the ceramic substrate 11. For this reason, in the embodiment, the pressure applied to the ceramic substrate 11 and the like laminated is set to a range of 1 kgf/cm$^2$ to 35 kgf/cm$^2$ (0.10 MPa to 3.43 MPa). This pressure may be set to a range of 3 kgf/cm$^2$ to 18 kgf/cm$^2$ (0.29 MPa to 1.77 MPa).

When the heating time is 30 minutes or more in the heating step S02, since it is possible to ensure a sufficient amount of time required when P contained in the melted Cu—P—Sn—Ni brazing filler material 24 is combined with Ti contained in the Ti foil at the bonded interface between the ceramic substrate 11 and the Cu foil 22, the Cu—Sn layer can be reliably formed close to the ceramic substrate 11. When the heating time is 30 minutes or more, the Ti foil 25 and the Cu foil 22 can be sufficiently bonded to each other through diffusions in solids, the ceramic substrate 11 and the Cu foil 22 can be reliably bonded to each other. Even when the heating time exceeds 360 minutes, bondability between the ceramic substrate 11 and the circuit layer 12 is not improved compared to the case in which the heating time is 360 minutes. When the heating time exceeds 360 minutes, productivity is decreased. For this reason, in the embodiment, the heating time is set to be in a range of 30 minutes to 360 minutes. The heating time may be set to a range of 30 minutes to 150 minutes.

Since the bonded surfaces of the Ti foil 25 and the Cu foil 22 are made smooth surfaces previously, the occurrence of a gap being generated at the bonded interface therebetween can be limited, and the Ti foil 25 and the Cu foil 22 can be reliably bonded to each other.

In the power module substrate 10 and the power module 1 produced by the method in the embodiment, the circuit layer 12 made of the Cu foil 22 is formed on the first surface of the ceramic substrate 11, and thus it is possible to spread out heat from the semiconductor element 3, and to dissipate heat to the ceramic substrate 11. Since the Cu foil 22 has a high resistance to deformation, when the power module substrate 10 undergoes a thermal cycle, it is possible to limit deformation of the circuit layer 12. As a result, it is possible to limit deformation of the bonding layer 2 bonding the semiconductor element 3 to the circuit layer 12 to each other, and it is possible to improve the reliability of the bond.

Second Embodiment

Hereinafter, a second embodiment of the present invention will be described. The same reference signs will be assigned to the same configuration elements as in the first embodiment, and detailed descriptions thereof will be omitted.

Figure 6:
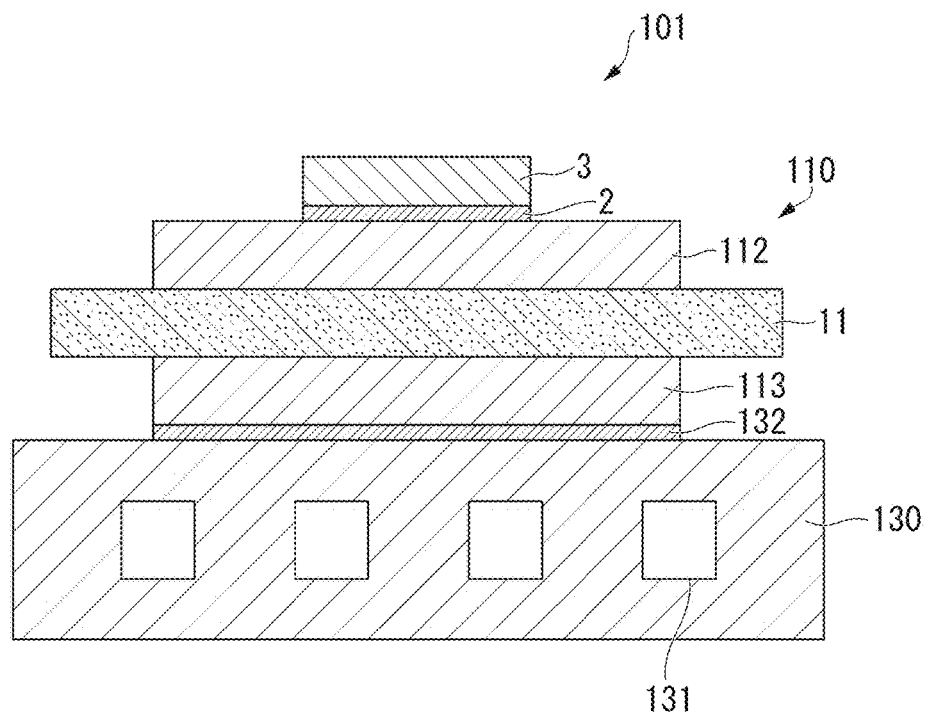
FIG. 6 is a schematic view of a power module in which a power module substrate is used in a second embodiment of the present invention.

FIG. 6 shows a power module 101 including a power module substrate 110 in the second embodiment.

The power module 101 includes: the power module substrate 110 in which a circuit layer 112 is provided on the first surface of the ceramic substrate 11; the semiconductor element 3 that is bonded to a surface at one side (an upper surface in FIG. 6) of the circuit layer 112 through the bonding layer 2; and a heat sink 130 disposed on the other side (a lower side in FIG. 6) of the power module substrate 110.

Figure 7:
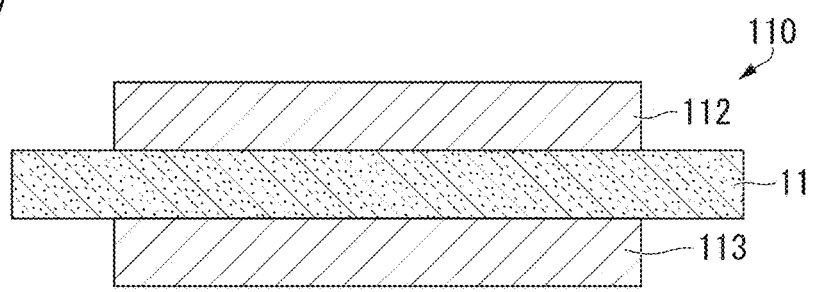
FIG. 7 is a schematic view of the power module substrate in the second embodiment of the present invention.

As shown in FIG. 7, the power module substrate 110 includes the ceramic substrate 11; the circuit layer 112 (Cu member) provided on the first surface (an upper surface in FIG. 7) which is one surface of the ceramic substrate 11; and a metal layer 113 (Cu member) provided on the second surface (a lower surface in FIG. 7) which is the other surface of the ceramic substrate 11.

Figure 11:
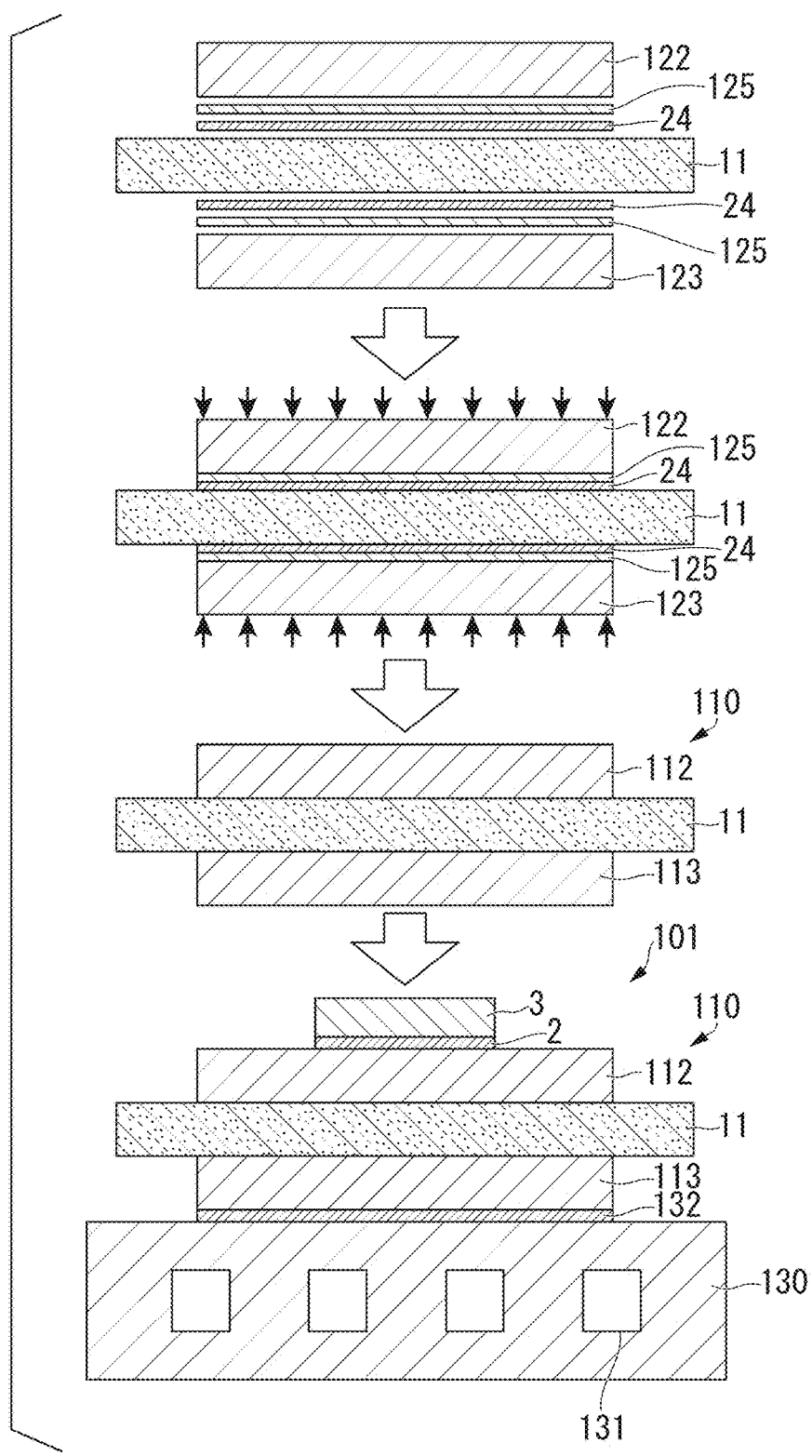
FIG. 11 shows schematic views showing the method of producing the power module substrate and the power module in the second embodiment of the present invention.

Similar to the first embodiment, the circuit layer 112 is formed by bonding a Cu foil 122 to the ceramic substrate 11 through the heating of the Cu—P—Sn—Ni brazing filler material 24 (Cu—P-based brazing filler material), Ti foil 125 (active metal material), and the Cu foil 122 made of oxygen-free copper which are sequentially laminated on the first surface of the ceramic substrate 11 (refer to FIG. 11). In the second embodiment, the thickness of the Ti foil 125 is set to a range of 0.5 μm to 5 μm.

The thickness of the circuit layer 112 is set to a range of 0.1 mm to 1.0 mm. In the second embodiment, the thickness is set to 0.6 mm.

Figure 8:
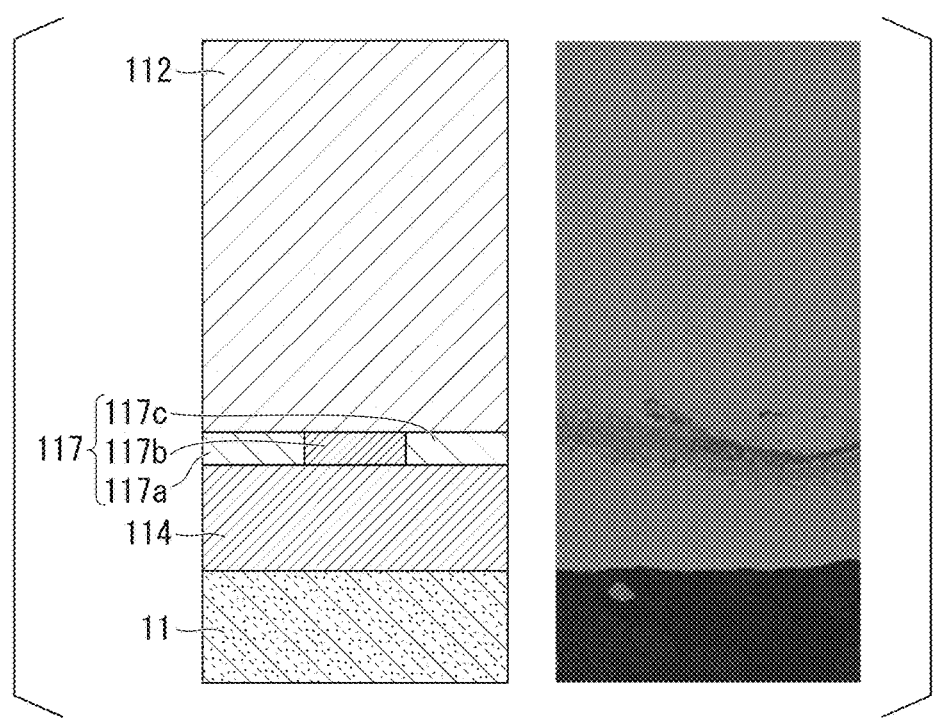
FIG. 8 is an electron micrograph obtained by capturing an image of the section of the bonded interface between a circuit layer and a ceramic substrate shown in FIG. 7, and a schematic view thereof.

FIG. 8 shows an electron micrograph obtained by capturing an image of the bonded interface between the ceramic substrate 11 and the circuit layer 112, and a schematic view thereof. As shown in FIG. 8, a Cu—Sn layer 114 and an intermetallic compound layer 117 are formed at the bonded interface between the ceramic substrate 11 and the circuit layer 112. The Cu—Sn layer 114 is positioned close to the ceramic substrate 11, and the intermetallic compound layer 117 is positioned between the circuit layer 112 and the Cu—Sn layer 114, and contains P, Ni, and Ti.

The Cu—Sn layer 114 is a layer in which Sn forms a solid solution with Cu. P and Ni contained in the Cu—P—Sn—Ni brazing filler material 24 are drawn into the intermetallic compound layer 117 formed close to the circuit layer 112, and thereby the Cu—Sn layer 114 is formed.

P and Ni contained in the Cu—P—Sn—Ni brazing filler material 24 are combined with Ti contained in the Ti foil 125, and thereby the intermetallic compound layer 117 is formed. The intermetallic compound layer 117 includes one or more of a P—Ni—Ti phase 117a, a P—Ti phase 117b, and a Cu—Ni—Ti phase 117c.

In the embodiment, as shown in FIG. 8, the intermetallic compound layer 117 includes the P—Ni—Ti phase 117a, the P—Ti phase 117h, and the Cu—Ni—Ti phase 117c.

That is, since the Ti foil 125 in the embodiment is thinner than that in the first embodiment, the Ti layer formed in the first embodiment is not substantially formed. For this reason, one or more phases of the P—Ni—Ti phase 117a, the P—Ti phase 117b, and the Cu—Ni—Ti phase 117c co-exists in the intermetallic compound layer 117.

The metal layer 113 is formed by bonding a metal plate made of Cu or a Cu alloy to the second surface of the ceramic substrate 11 through a Cu—P-based brazing filler material. In the second embodiment, the metal layer 113 is formed by bonding a Cu foil 123 to the ceramic substrate 11 through the heating of the Cu—P—Sn—Ni brazing filler material 24, the Ti foil 125, and the Cu foil 123 with a purity of 99.99 mass % or greater which are sequentially laminated on the second surface of the ceramic substrate 11 (refer to FIG. 11).

The thickness of the metal layer 113 is set to a range of 0.1 mm to 1.0 mm. In the embodiment, the thickness is set to 0.6 mm.

Figure 9:
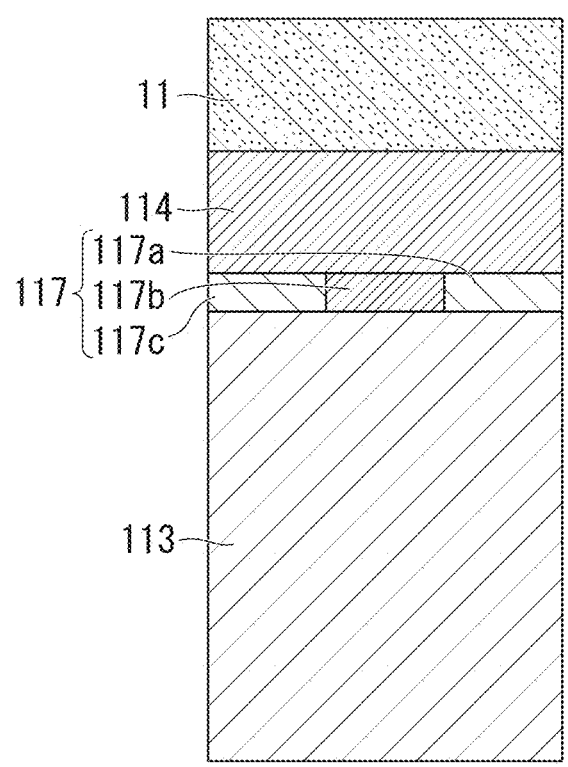
FIG. 9 is a schematic view of the section of the bonded interface between a metal layer and a ceramic substrate shown in FIG. 7.

FIG. 9 is a schematic view of the bonded interface between the ceramic substrate 11 and the metal layer 113. In the embodiment, as shown in FIG. 9, the Cu—Sn layer 114 and the intermetallic compound layer 117 are formed at the bonded interface between the ceramic substrate 11 and the metal layer 113. The Cu—Sn layer 114 is positioned close to the ceramic substrate 11, and the intermetallic compound layer 117 is positioned between the metal layer 113 and the Cu—Sn layer 114, and contains P, Ni, and Ti. The intermetallic compound layer 117 includes the P—Ni—Ti phase 117a, the P—Ti phase 117b, and the Cu—Ni—Ti phase 117c.

That is, the bonded interface between the ceramic substrate 11 and the metal layer 113 has the same structure as that of the bonded interface between the ceramic substrate 11 and the circuit layer 112.

The heat sink 130 dissipates heat from the power module substrate 110. The heat sink 130 is made of Cu or a Cu alloy. In the embodiment, the heat sink 130 is made of oxygen-free copper. The heat sink 130 is provided with flow passages 131 through which a coolant flows. In the embodiment, the heat sink 130 and the metal layer 113 are bonded to each other through a solder layer 132 made of a solder material.

Figure 10:
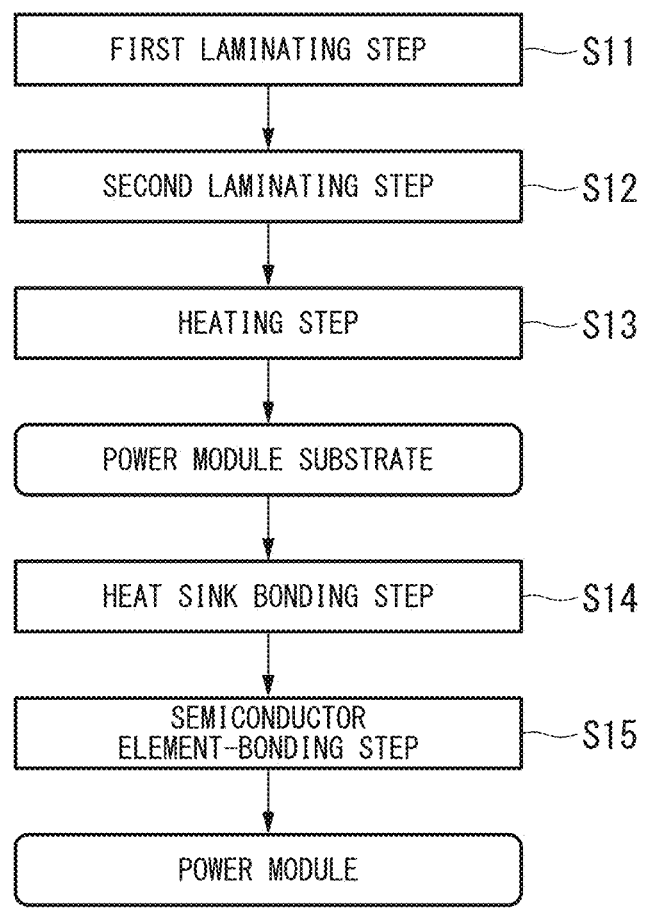
FIG. 10 is a flowchart showing a method of producing the power module substrate and the power module in the second embodiment of the present invention.

Hereinafter, a method of producing the power module 101 in the embodiment will be described with reference to the flowchart in FIG. 10, and FIG. 11.

First, as shown in FIG. 11, the Cu—P—Sn—Ni brazing filler material 24, the Ti foil 125, and the Cu foil 122 which forms into the circuit layer 112 are sequentially laminated on the first surface (an upper surface in FIG. 11) of the ceramic substrate 11 (a first laminating step S11). In addition. Cu—P—Sn—Ni brazing filler material 24, the Ti foil 125, and the Cu 123 plate which forms into the metal layer 113 are sequentially laminated on the second surface (a lower surface in FIG. 11) of the ceramic substrate 11 (a second laminating step S12). That is, the Cu—P—Sn—Ni brazing filler material 24 is disposed close to the ceramic substrate 11, and the Ti foil 125 is disposed close to each of the Cu foils 122, 123 between the ceramic substrate 11 and each of the Cu foils 122, 123. In the embodiment, the compositions of the Cu—P—Sn—Ni brazing filler material 24 are Cu, 7 mass % of P, 15 mass % of Sn, and 10 mass % of Ni. The thickness of the Cu—P—Sn—Ni brazing filler material 24 is 20 μm. Ti foil with a thickness of 1 μm and a purity of 99.8% is used as the Ti foil 125.

Subsequently, the ceramic substrate 11, the Cu—P—Sn—Ni brazing filler material 24, the Ti foil 125, and the Cu foils 122 and 123 are placed into and heated in a vacuum heating furnace while being pressurized (at a pressure of 1 kgf/cm$^2$ to 35 kgf/cm$^2$ (0.10 MPa to 3.43 MPa)) in a laminating direction (heating step S13). In the second embodiment, the internal pressure of the vacuum heating furnace is set to a range of $10^{-6}$ Pa to $10^{-3}$ Pa, the heating temperature is set to a range of 600° C. to 650° C., and the heating time is set to a range of 30 minutes to 360 minutes.

In the heating step S13, the Cu—P—Sn—Ni brazing filler material 24 is melted to form a liquid phase, the Ti foil 125 is melted into the liquid phase, and the liquid phase is solidified. Thereby, the ceramic substrate 11 is bonded to the Cu foils 122 and 123. At this time, P and Ni contained in the Cu—P—Sn—Ni brazing filler material 24 are combined with Ti in the Ti foil 125, and thereby the intermetallic compound layer 117 is formed. In addition, the Cu—Sn layer 14 not containing P and Ni or containing a very small amount of P and Ni is formed close to the ceramic substrate 11.

Accordingly, the circuit layer 112 and the metal layer 113 are respectively formed on the first surface and the second surface of the ceramic substrate 11 such that the power module substrate 110 in the embodiment is produced.

Subsequently, the heat sink 130 is bonded to a lower surface of the metal layer 113 of the power module substrate 110 through a solder material (heat sink bonding step S14).

Subsequently, the semiconductor element 3 is bonded to the upper surface of the circuit layer 112 of the power module substrate 110 through a solder material (semiconductor element-bonding step S15).

As such, the power module 101 in the embodiment is produced.

According to the method of producing the power module substrate 110 with such a configuration in the embodiment, as described in the first embodiment, a rigid intermetallic compound layer is not formed at the bonded interface between the ceramic substrate 11 and the Cu—Sn layer 114 which is positioned at each of the bonded interface between the ceramic substrate 111 and the circuit layer 112 and the bonded interface between the ceramic substrate 11 and the metal layer 113. For this reason, the bonding rates between the ceramic substrate 11 and the circuit layer 112 and between the ceramic substrate 11 and the metal layer 113, are improved. Thus, the circuit layer 112 and the metal layer 113 can be sufficiently bonded to the ceramic substrate 11, respectively.

Since the circuit layer 112 and the metal layer 113 can be respectively bonded to the first surface and the second surface of the ceramic substrate 11 simultaneously, it is possible to reduce producing costs.

The metal layer 113 made of the Cu foil 123 is formed on the second surface of the ceramic substrate 11, and thus the power module substrate 110 is capable of efficiently dissipating heat from the semiconductor element 3 through the metal layer 113.

Since the heat sink 130 is bonded to the metal layer 113, the power module substrate 110 in the second embodiment is capable of efficiently dissipating heat through the heat sink 130.

Third Embodiment

Hereinafter, a third embodiment of the present invention will be described. The same reference signs will be assigned to the same configuration elements as in the first embodiment, and detailed descriptions thereof will be omitted.

Figure 12:
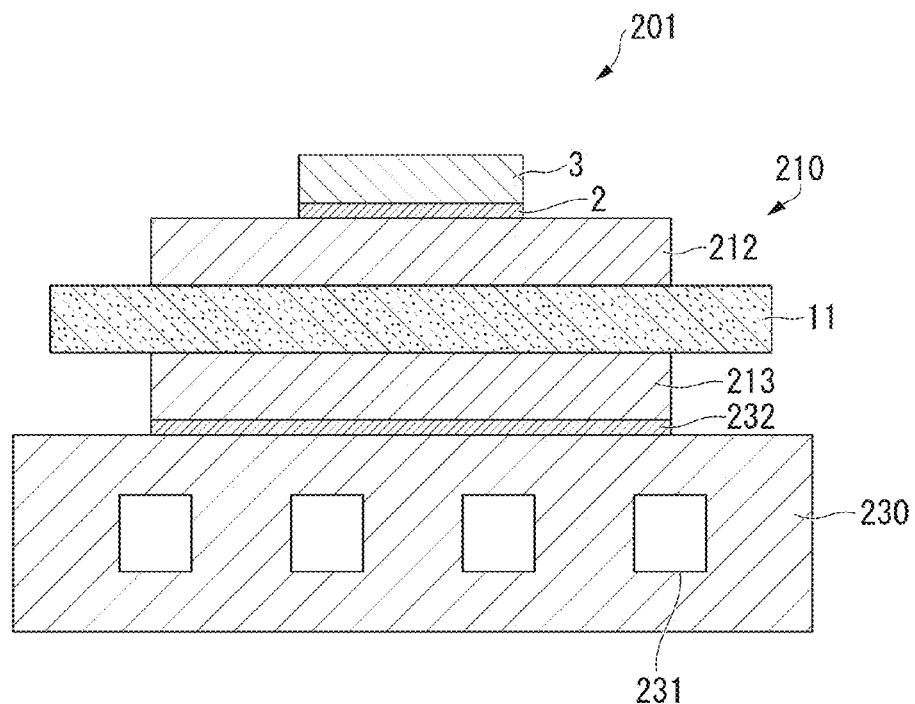
FIG. 12 is a schematic view of a power module in which a power module substrate is used in a third embodiment of the present invention.

FIG. 12 shows a power module 201 including a power module substrate 210 in the third embodiment.

The power module 201 includes: the power module substrate 210 in which a circuit layer 212 is provided on the first surface of the ceramic substrate 11; the semiconductor element 3 that is bonded to a surface at one side (an upper surface in FIG. 12) of the circuit layer 212 through the bonding layer 2; and a heat sink 230 bonded to the other side (a lower side in FIG. 12) of the power module substrate 210 through a bonding layer 232.

Figure 13:
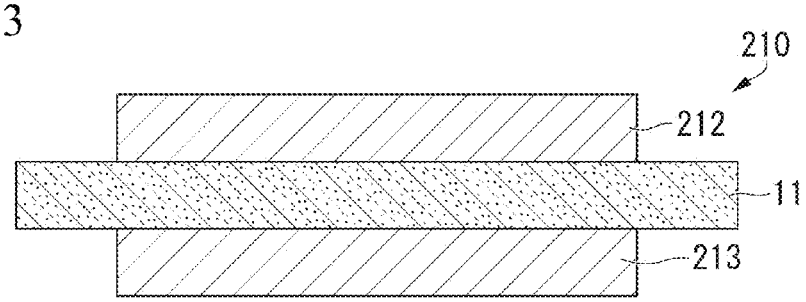
FIG. 13 is a schematic view of the power module substrate in the third embodiment of the present invention.

As shown in FIG. 13, the power module substrate 210 includes the ceramic substrate 11; the circuit layer 212 (Cu member) provided on the first surface (an upper surface in FIG. 13) which is one surface of the ceramic substrate 11; and a metal layer 213 (Al member) provided on the second surface (a lower surface in FIG. 13) which is the other surface of the ceramic substrate 11.

Figure 16:
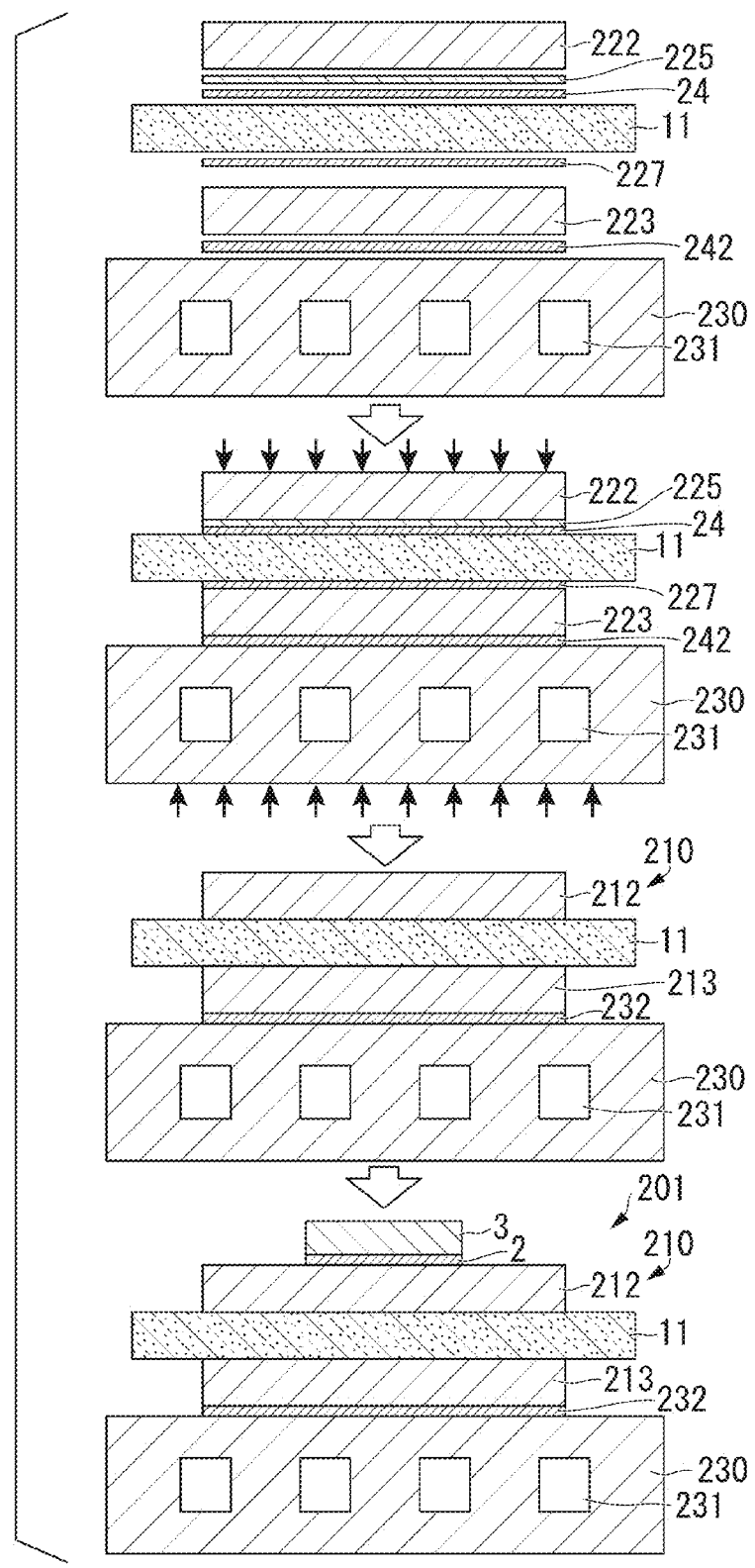
FIG. 16 shows schematic views showing the method of producing the power module substrate and the power module in the third embodiment of the present invention.

The circuit layer 212 is formed by bonding a Cu foil 222 to the ceramic substrate 11 through the heating of the Cu—P—Sn—Ni brazing filler material (Cu—P-based brazing filler material) 24, a Ti paste 225, and the Cu foil 222 made of oxygen-free copper which are sequentially laminated on the first surface of the ceramic substrate 11 (refer to FIG. 16). The Ti paste 225 is a paste containing Ti powder (active metal material), resin, and a solvent.

Ethyl cellulose, methyl cellulose, polymethyl methacrylate, acrylic resin, alkyd resin, and the like can be used as the resin. Methyl cellosolve, ethyl cellosolve, terpineol, toluene, Texanol, triethyl cirtrate, and the like can be used as the solvent.

The purity of the Ti powder may be 99.4% or more. In the embodiment, the purity is 99.7%.

The thickness of the circuit layer 212 is set to a range of 0.1 mm to 1.0 mm. In the third embodiment, the thickness is set to 0.3 mm.

Figure 14:
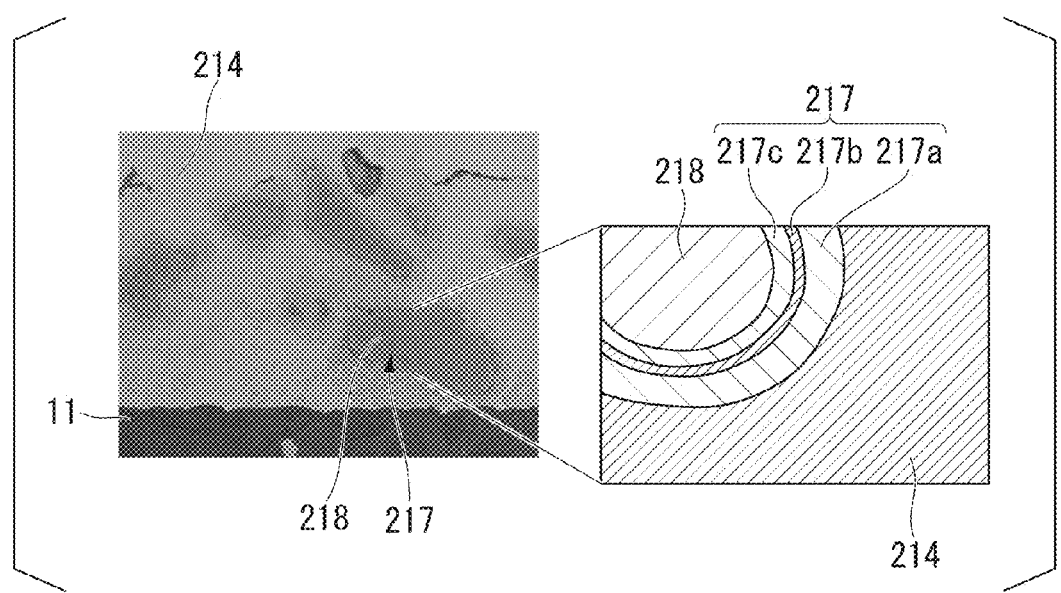
FIG. 14 is an electron micrograph obtained by capturing an image of the section of the bonded interface between a circuit layer and a ceramic substrate shown in FIG. 13, and a schematic view thereof.

As shown in FIG. 14, a Cu—Sn layer 214 (Cu layer) is formed at the bonded interface between the ceramic substrate 11 and the circuit layer 212. Intermetallic compounds 217 containing P, Ni, and Ti are dispersed in the Cu—Sn layer 214.

The Cu—Sn layer 214 is a layer in which Sn forms a solid solution with Cu. P and Ni contained in the Cu—P—Sn—Ni brazing filler material 24 are drawn into the intermetallic compounds 217, and thereby the Cu—Sn layer 214 is formed.

P and Ni contained in the Cu—P—Sn—Ni brazing filler material 24 are combined with Ti in the Ti powder, and thereby the intermetallic compounds 217 are formed. In the embodiment, as shown in FIG. 14, the intermetallic compound 217 includes a Cu—Ni—Ti phase 217c, a P—Ti phase 217b, and a P—Ni—Ti phase 217a. The Cu—Ni—Ti phase 217c, the P—Ti phase 217b, and the P—Ni—Ti phase 217a are formed in the shape of an annular ring sequentially from the inside so as to surround a Ti particle 218 present in the Cu—Sn layer 214. Only the annular ring-shaped intermetallic compound 217 without the Ti particle 218 may be formed.

The Cu—Ni—Ti phase 217c, the P—Ti phase 217b, and the P—Ni—Ti phase 217a of the annular ring-shaped intermetallic compound 217 may be partially lost and discontinuous.

The metal layer 213 is formed by bonding a metal plate made of Al or an Al alloy to the second surface of the ceramic substrate 11. In the third embodiment, the metal layer 213 is formed by bonding an Al plate 223 with a purity of 99.99 mass % or more to the second surface of the ceramic substrate 11 (refer to FIG. 16).

The thickness of the metal layer 213 is set to a range of 0.1 mm to 3.0 mm. In the embodiment, the thickness is set to 1.6 mm.

The heat sink 230 is made of Al or an Al alloy. In the embodiment, the heat sink 230 is made of A6063 (Al alloy). The heat sink 230 is provided with flow passages 231 through which a coolant flows. The heat sink 230 and the metal layer 213 are bonded to each other through an Al—Si-based brazing filler material.

Figure 15:
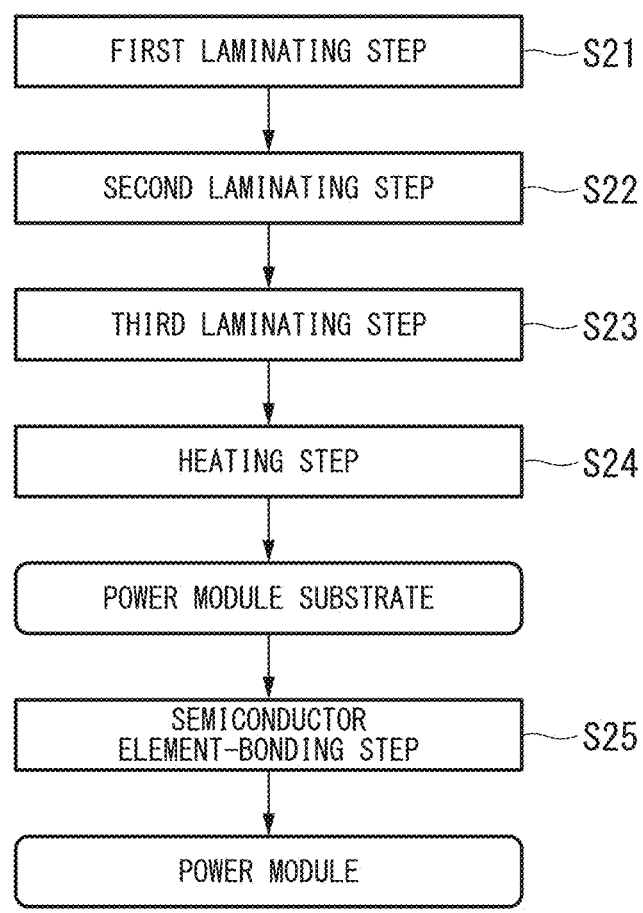
FIG. 15 is a flowchart showing a method of producing the power module substrate and the power module in the third embodiment of the present invention.

Hereinafter, a method of producing the power module 201 in the embodiment will be described with reference to the flowchart in FIG. 15, and FIG. 16.

First, as shown in FIG. 16, the Ti paste 225 is applied on a lower surface (bonded surface) of the Cu foil 222 which forms into the circuit layer 212 using screen-printing, and is dried. The Cu—P—Sn—Ni brazing filler material 24 and the Cu foil 222 are sequentially laminated on the first surface (an upper surface in FIG. 16) of the ceramic substrate 11 (a first laminating step S21). The Al plate 223 which forms into the metal layer 213 is laminated on the second surface (a lower surface in FIG. 16) of the ceramic substrate 11 with the bonding material 227 interposed between the Al plate 223 and the ceramic substrate 11 (a second laminating step S22). The heat sink 230 is laminated on a lower side of the Al plate 223 with a bonding material 242 interposed between the heat sink 230 and the Al plate 223 (a third laminating step S23). In the first laminating step S21, the Cu—P—Sn—Ni-based brazing filler material 24 is disposed so as to overlap with the Ti paste 225 which has been applied on the Cu foil 222 and dried.

In the embodiment, the Ti powder contained in the Ti paste 225 has a particle diameter of 5 μm to 40 μm. An amount of the Ti powder in the Ti paste 225 preferably is 40 mass % to 90 mass %.

The Ti paste 225 is preferably applied such that the Ti amount is 2 mg/cm$^2$ to 10 mg/cm$^2$.

The drying is preferably performed at a range of 120° C. to 150° C. for 10 minutes to 30 minutes.

In the embodiment, the bonding materials 227 and 242 are Al—Si-based brazing filler materials containing Si which lowers a melting point. In the third embodiment, an Al—Si (7.5 mass %) brazing filler material is used.

In the embodiment, the compositions of the Cu—P—Sn—Ni brazing filler material 24 are Cu, 7 mass % of P, 15 mass % of Sn, and 10 mass % of Ni, and the thickness is 20 μm.

Subsequently, the ceramic substrate 11, the Cu—P—Sn—Ni brazing filler material 24, the Ti paste 225, the Cu foil 222, the bonding material 227, the Al plate 223, the bonding material 242, and the heat sink 230 are placed into and heated in a vacuum heating furnace while being pressurized (at a pressure of 1 kgf/cm$^2$ to 35 kgf/cm$^2$ (0.10 MPa to 3.43 MPa)) in a laminating direction (heating step S24). In the third embodiment, the internal pressure of the vacuum heating furnace is set to a range of 10$^{-6}$ Pa to 10$^{-3}$ Pa, the heating temperature is set to a range of 600° C. to 650° C., and the heating time is set to a range of 30 minutes to 360 minutes.

In the heating step S24, the Cu—P—Sn—Ni brazing filler material 24 is melted to form a liquid phase, the Ti paste 225 is melted into the liquid phase and is solidified, and thereby the ceramic substrate 11 is bonded to the Cu foil 222. In the heating step S24, the bonding material 227 is melted to form a liquid phase, the liquid phase is solidified, and thereby the ceramic substrate 11 is bonded to the Al plate 223 through the bonding material 227. In the heating step S24, the bonding material 242 is melted to form a liquid phase, the liquid phase is solidified, and thereby the Al plate 223 is bonded to the heat sink 230 through the bonding material 242.

Accordingly, the power module substrate 210 in the third embodiment is produced.

Subsequently, the semiconductor element 3 is bonded to the upper surface of the circuit layer 212 of the power module substrate 210 through a solder material (semiconductor element-bonding step S25).

As such, the power module 201 in the third embodiment is produced.

The method of producing the power module substrate 210 with such a configuration according to the third embodiment includes the first laminating step S21 of laminating the Cu foil 222 on the ceramic substrate 11 through the Ti paste 225 containing the Ti powder (active metal material) and the Cu—Sn—Ni—P brazing filler material 24, and the heating step S24 of heating the ceramic substrate 11 and the Cu foil 222 laminated. Therefore, in the heating step S24, Ti in the Ti powder is combined with P and Ni contained in the Cu—Sn—Ni—P brazing filler material 24 such that the intermetallic compounds 217 are formed, and P is drawn into the intermetallic compounds 217. As a result, the Cu—Sn layer 214 is formed. Since the intermetallic compounds 217 are dispersed in the Cu—Sn layer 214, and a rigid intermetallic compound layer is formed at the bonded interface between the ceramic substrate 11 and the Cu—Sn layer 214, the bonding rate between the ceramic substrate 11 and the circuit layer 212 is improved, and the ceramic substrate 11 and the circuit layer 212 can be sufficiently bonded to each other.

Since the circuit layer 212 and the metal layer 213 are respectively bonded to the first surface and the second surface of the ceramic substrate 11 simultaneously, and the heat sink 230 is bonded to the metal layer 213 simultaneously, it is possible to simplify a producing process, to reduce an amount of time required for producing, and to reduce producing costs. Since the Cu foil 222 and the Al plate 223 can be bonded to the ceramic substrate 11 in a single heating process, it is possible to reduce the thermal load applied to the ceramic substrate 11 compared to when the Cu foil 222 and the Al plate 223 are independently bonded to the ceramic substrate 11. For this reason, it is possible to reduce an amount of warpage of the ceramic substrate 11, and to limit the occurrence of cracking in the ceramic substrate 11.

Since Al has a relatively low resistance to deformation, when the power module substrate 210 in the third embodiment undergoes a thermal cycle, the metal layer 213 is capable of absorbing thermal stress occurring between the power module substrate 210 and the heat sink 230. As a result, it is possible to limit the occurrence of cracking in the ceramic substrate 11.

Since the metal layer 213 formed of the Al plate 223 is formed on the second surface of the ceramic substrate 11, when the power module substrate 210 undergoes a thermal cycle, the metal layer 213 is capable of absorbing thermal stress occurring between the power module substrate 210 and the heat sink 230. As a result, it is possible to suppress the occurrence of cracking in the ceramic substrate 11.

The embodiments of the present invention have been described; however, the present invention is not limited to the embodiments, and modifications can be appropriately made to the embodiments insofar as the modifications do not depart from the technical spirit of the invention.

In the third embodiment, screen-printing is used for the application of the Ti paste; however, various methods such as offset printing and a photosensitive process can be adopted.

In the third embodiment, the Ti paste 225 is disposed close to the Cu foil 222, and the Cu—P—Sn—Ni-based brazing filler material 24 is disposed close to the ceramic substrate 11; however, the Ti paste 225 may be disposed close to the ceramic substrate 11, and the Cu—P—Sn—Ni-based brazing filler material 24 may be disposed close to the Cu foil 222.

In the third embodiment, the Ti paste and the Cu—P—Sn—Ni-based brazing filler material are disposed between the ceramic substrate and the Cu foil; however, the active metal material is not limited to the Ti paste, and for example, Ti powder (active metal material) and a Cu—P—Sn-based brazing filler material may be disposed between the ceramic substrate and the Cu foil. Hydrogenated titanium powder can be used instead of the Ti powder. When a Ti paste containing hydrogenated Ti powder is used, the Ti paste is preferably applied such that the TiH$_2$ amount is in a range of 0.04 mg/cm$^2$ to 8 mg/cm$^2$. More preferably, the TiH$_2$ amount is in a range of 0.5 mg/cm$^2$ to 7 mg/cm$^2$. The hydrogenated titanium powder used preferably has a particle diameter of 15 μm or less, and more preferably, a particle diameter of 5 μm or less.

In the third embodiment, a foil-like brazing filler material is used as the Cu—P—Sn—Ni-based brazing filler material; however, a brazing filler paste containing Cu—P—Sn—Ni-based brazing filler powder can be used. It is possible to prepare this brazing filler paste by using the Cu—P—Sn—Ni-based brazing filler powder in the Ti paste instead of the Ti powder.

In the third embodiment, it is possible to use a paste (brazing filler material/Ti paste) obtained by mixing this brazing filler paste and the Ti paste. In this case, the brazing filler metal/Ti paste may be applied to any one of the ceramic substrate and the Cu foil.

In the third embodiment, the Ti paste can be degreased in the first laminating step S21. In this case, a residual amount of resin contained in the Ti paste is decreased, and thereby bondability is further improved.

In the embodiments, the ceramic substrate and the Al plate are bonded to each other through an Al—Si-based brazing filler material as a bonding material; however, the bonding material is not limited to the Al—Si-based brazing filler material, and the ceramic substrate and the Al plate may be bonded to each other by a transient liquid phase (TLP) bonding method. According to the transient liquid phase bonding method, after a fixing layer is formed by fixing an additive element such as Si or Cu to the bonded surface (which is bonded to the ceramic substrate) of the Al plate by a sputtering method or the like, the ceramic substrate and the Al plate are laminated, are pressurized in a laminating direction, and then are heated. Thereby, the ceramic substrate and the Al plate can be bonded to each other. That is, according to the transient liquid phase bonding method, the ceramic substrate and the Al plate can be laminated with the fixing layer as a bonding material interposed therebetween, and the Cu foil and the Al plate can be bonded to the ceramic substrate simultaneously.

In the transient liquid phase bonding method, pressure applied in the laminating direction is set to a range of 1 kgf/cm$^2$ to 35 kgf/cm$^2$ (0.10 MPa to 3.43 MPa). In the heating step, the heating temperature is set to a range of 600° C. to 650° C., and the heating time is set to a range of 30 minutes to 360 minutes.

In addition to Si or Cu, an additive element such as Zn, Ge, Ag, Mg, Ca, Ga, and Li may be used as the additive element of the fixing layer.

It is possible to bond the ceramic substrate and the Al plate to each other by using a metal paste containing metal particles and organic matter as a bonding material. An example of the metal paste is a Ag paste containing Ag particles and organic matter. Specifically, the Ag paste is applied on the second surface of the ceramic substrate using screen-printing or the like, and the ceramic substrate and the Al plate are laminated with the Ag paste interposed therebetween and heated. As a result, the Al plate can be bonded to the ceramic substrate. When bonding is performed using the Ag paste, pressure applied in the laminating direction is set to a range of 1 kgf/cm$^2$ to 35 kgf/cm$^2$ (0.10 MPa to 3.43 MPa). In the heating step, the heating temperature is set to a range of 600° C. to 650° C., and the heating time is set to a range of 30 minutes to 360 minutes.

In the embodiments, the metal layer and the heat sink are bonded to each other through an Al—Si-based brazing filler material: however, the bonding material is not limited to the Al—Si-based brazing filler material, and the metal layer and the heat sink may be bonded to each other using a fixing layer by the transient liquid phase (TLP) bonding method. The metal layer and the heat sink may be bonded to each other through a Ag paste containing Ag particle and organic matter.

In the second and third embodiments, the circuit layer and the metal layer are respectively bonded to the first surface and the second surface of the ceramic substrate simultaneously; however, the circuit layer and the metal layer may be independently bonded to the respective surfaces of the ceramic substrate.

In the first and second embodiments, the Ti foil is used; however, it is possible to use a Cu member/active metal clad material in which an active metal material is provided on one surface of a Cu member. It is possible to use a Cu member on which active metal is provided by vapor deposition or the like.

In addition, it is possible to use an active metal/brazing filler clad material in which a Cu—P—Sn-based brazing filler material is provided on one surface of an active metal material, or a Cu member/active metal/brazing filler clad material in which a Cu member, an active metal material, and a Cu—P—Sn-based brazing filler material are sequentially laminated.

The heat sink is provided with the cooling flow passages; however, the structure of the heat sink is not limited to a specific structure, and for example, an air-cooling type-heat sink may be adopted. The heat sink may have heat-dissipating fins.

In the embodiments, the heat sink is bonded to the other surface of the power module substrate; however, the heat sink may not be bonded to the power module substrate.

In the embodiments, the power module substrate and the heat sink are bonded to each other through a solder material or a brazing filler material; however, grease may be applied between the power module substrate and the heat sink, and the power module substrate and the heat sink may be fixed together with screws.

EXAMPLES

Example 1

Hereinafter, results of confirmation tests (Example 1) performed to confirm the effects of the embodiments of the present invention will be described.

Active metal materials (37 mm×37 mm) with thicknesses shown in Tables 1 and 2; sheets of Cu—P-based brazing filler foil (37 mm×37 mm×40 μm thickness); and Cu foils (37 mm×37 mm×0.3 mm thickness) made of oxygen-free copper were laminated on first surfaces of ceramic substrates (40 mm×40 mm) shown in Tables 1 and 2. When the material of the ceramic substrate was AlN, the thickness of the ceramic substrate was set to 0.635 mm, and when the material was $Si_3N_4$, the thickness was set to 0.32 mm.

When the type of the active metal material was powder, a paste containing the active metal powder was applied on the ceramic substrate or the Cu foil by screen-printing, and laminated. This paste contained the active metal powder (Ti powder with a purity of 99.8%) with a particle diameter of 5 μm to 40 μm, acrylic resin, and Texanol. The application amounts are shown in Table 2. The active metal material and the Cu—P-based brazing filler material were disposed as shown in Tables 1 and 2.

In Comparative Example 1, only the Cu—P-based brazing filler material was interposed between the ceramic substrate and the Cu foil without the active metal material being interposed therebetween.

While being pressurized at a pressure of 15 kgf/cm$^2$ (1.47 MPa) in a laminating direction, the ceramic substrate, and the like, which were laminated, were placed into and heated in a vacuum heating furnace. Thereby, the Cu foil was bonded to the first surface of the ceramic substrate, and a circuit layer was formed. The internal pressure of the vacuum heating furnace was set to a range of 10$^{-6}$ Pa to 10$^{-3}$ Pa, and the heating temperature and the heating time were set to the conditions shown in Tables 1 and 2. When the Cu—P-based brazing filler material contained Zn, the ceramic substrate and the like were heated in a nitrogen atmosphere instead of being heated in the vacuum heating furnace.

As such, the power module substrates in Examples 1 to 32 of the present invention and Comparative Examples 1 to 3 were obtained.

In each of the power module substrates obtained in the aforementioned manner, the initial bonding rate between the circuit layer and the ceramic substrate was evaluated. In each of the power module substrates in Examples 1 to 21 and Comparative Examples 1 to 3, it was confirmed whether an active metal layer was present at the bonded interface between the circuit layer and the ceramic substrate. A method of evaluating the bonding rate and a method of confirming whether the active metal layer was present will be described below.

(Evaluation of Bonding Rate)

In the power module substrate, the bonding rate of the interface between the ceramic substrate and the circuit layer was evaluated by an ultrasonic flaw detector (FineSAT200 manufactured by Hitachi Power Solutions), and was calculated by the following expression.

An initial bonding area was an area before bonding, which has to be bonded.

In the examples, the initial bonding area was the area (37 mm×37 mm) of the circuit layer. Exfoliation in an image obtained by binarizing an ultrasonic-detected image was shown by a white portion in a bonding portion, and thus the area of the white portion was deemed to be an exfoliation area.

(Bonding Rate (%))=((Initial Bonding Area)−(Exfoliation Area))/(Initial Bonding Area)×100

(Method of Confirming Whether Active Metal Layer is Present)

It was confirmed whether the active metal layer was present by obtaining an element mapping of the active metal material at the bonded interface (section in parallel with the laminating direction) between the circuit layer and the ceramic substrate using Electron Micro Analyzer (EPMA) (JXA-8530F manufactured by JEOL).

TABLE 1

| | Components of Cu—P-based Brazing Filler Material (mass %) | | | | | | | Type of Active Metal Material | Thickness of Active Metal Material μm | Position of Active Metal Material |
|---|---|---|---|---|---|---|---|---|---|---|
| | P | Sn | Ni | Cr | Fe | Mn | Zn | Balance | | |
| Example 1 | 7 | 15 | 10 | — | — | — | — | Cu | Ti Foil | 2 | Close to Cu foil |
| Example 2 | 7 | 15 | 10 | — | — | — | — | Cu | Ti Foil | 2 | Close to Ceramic Substrate |
| Example 3 | 3 | — | — | — | — | — | — | Cu | Ti Foil | 10 | Close to Cu foil |
| Example 4 | 10 | — | — | — | — | — | — | Cu | Ti Foil | 10 | Close to Cu foil |
| Example 5 | 7 | 0.5 | — | — | — | — | — | Cu | Ti Foil | 20 | Close to Cu foil |
| Example 6 | 7 | 25 | — | — | — | — | — | Cu | Ti Foil | 20 | Close to Cu foil |
| Example 7 | 7 | 15 | 2 | — | — | — | — | Cu | Ti Foil | 25 | Close to Cu foil |
| Example 8 | 7 | 15 | 20 | — | — | — | — | Cu | Ti Foil | 25 | Close to Cu foil |
| Example 9 | 7 | 15 | 8 | 2 | — | — | — | Cu | Ti Foil | 25 | Close to Cu foil |
| Example 10 | 7 | 15 | 8 | 20 | — | — | — | Cu | Ti Foil | 25 | Close to Cu foil |
| Example 11 | 7 | 15 | 8 | — | 2 | — | — | Cu | Ti Foil | 3 | Close to Cu foil |
| Example 12 | 7 | 15 | 8 | — | 20 | — | — | Cu | Ti Foil | 3 | Close to Cu foil |
| Example 13 | 7 | 15 | 8 | — | — | 2 | — | Cu | Ti Foil | 3 | Close to Cu foil |
| Example 14 | 7 | 15 | 8 | — | — | 20 | — | Cu | Ti Foil | 3 | Close to Cu foil |
| Example 15 | 7 | — | — | — | — | — | 0.5 | Cu | Ti Foil | 20 | Close to Cu foil |
| Example 16 | 7 | — | — | — | — | — | 50 | Cu | Ti Foil | 20 | Close to Cu foil |
| Example 17 | 7 | 15 | 10 | — | — | — | — | Cu | Zr Foil | 4 | Close to Cu foil |
| Example 18 | 7 | 15 | 10 | — | — | — | — | Cu | Nb Foil | 4 | Close to Cu foil |
| Example 19 | 7 | 15 | 10 | — | — | — | — | Cu | Hf Foil | 4 | Close to Cu foil |
| Example 20 | 7 | 15 | 10 | — | — | — | — | Cu | Ti Foil | 2 | Close to Cu foil |
| Example 21 | 7 | 15 | 10 | — | — | — | — | Cu | Ti Foil | 2 | Close to Ceramic Substrate |
| Comparative Example 1 | 7 | 15 | 10 | — | — | — | — | Cu | — | — | Close to Cu foil |
| Comparative Example 2 | 1 | 10 | — | — | — | — | — | Cu | Ti Foil | 10 | Close to Cu foil |
| Comparative Example 3 | 20 | 10 | — | — | — | — | — | Cu | Ti Foil | 10 | Close to Cu foil |

| | Material of Ceramic Substrate | Heating Conditions | | Existence of Active Metal Layer | Initial Bonding Rate % |
|---|---|---|---|---|---|
| | | Temperature | Time | | |
| Example 1 | AlN | 650° C. | 300 min. | No | 98.8 |
| Example 2 | AlN | 650° C. | 300 min. | No | 97.6 |
| Example 3 | AlN | 1050° C. | 120 min. | No | 98.7 |
| Example 4 | AlN | 900° C. | 120 min. | No | 97.5 |
| Example 5 | AlN | 730° C. | 150 min. | Yes | 98.0 |
| Example 6 | AlN | 630° C. | 150 min. | Yes | 97.6 |
| Example 7 | AlN | 650° C. | 180 min. | Yes | 99.1 |
| Example 8 | AlN | 650° C. | 180 min. | Yes | 97.3 |
| Example 9 | AlN | 650° C. | 180 min. | Yes | 98.0 |
| Example 10 | AlN | 650° C. | 180 min. | Yes | 99.6 |
| Example 11 | AlN | 650° C. | 180 min. | No | 97.7 |
| Example 12 | AlN | 650° C. | 180 min. | No | 97.5 |
| Example 13 | AlN | 650° C. | 180 min. | No | 97.1 |
| Example 14 | AlN | 650° C. | 180 min. | No | 98.6 |
| Example 15 | AlN | 730° C. | 150 min. | Yes | 98.3 |
| Example 16 | AlN | 630° C. | 150 min. | Yes | 97.2 |
| Example 17 | AlN | 650° C. | 30 min. | No | 98.8 |

TABLE 1-continued

| | | | | | |
|---|---|---|---|---|---|
| Example 18 | AlN | 650° C. | 30 min. | No | 99.2 |
| Example 19 | AlN | 650° C. | 30 min. | No | 98.8 |
| Example 20 | $Si_3N_4$ | 650° C. | 300 min. | No | 97.6 |
| Example 21 | $Si_3N_4$ | 650° C. | 300 min. | No | 96.9 |
| Comparative Example 1 | AlN | 650° C. | 300 min. | — | 0.0 |
| Comparative Example 2 | AlN | 1080° C. | 90 min | No | 87.3 |
| Comparative Example 3 | AlN | 1050° C. | 90 min | No | 88.1 |

TABLE 2

| | Components of Cu—P-based Brazing Filler Material (mass %) | | | | | | | | Type of Active Metal Material | Ti Amount or $TiH_2$ Amount [mg/cm²] | Position of Active Metal Material | Material of Ceramic Substrate | Heating Conditions | | Initial Bonding Rate % |
|---|---|---|---|---|---|---|---|---|---|---|---|---|---|---|---|
| | P | Sn | Ni | Cr | Fe | Mn | Zn | Balance | | | | | Temperature | Time | |
| Example 22 | 7 | 15 | 10 | — | — | — | — | Cu | Ti Powder | 7 | Close to Cu foil | AlN | 650° C. | 300 min. | 98.6 |
| Example 23 | 7 | 15 | 10 | — | — | — | — | Cu | Ti Powder | 7 | Close to Ceramic Substrate | AlN | 650° C. | 300 min. | 97.3 |
| Example 24 | 7 | 15 | 10 | — | — | — | — | Cu | Ti Powder | 2 | Close to Cu foil | AlN | 650° C. | 300 min. | 98.8 |
| Example 25 | 7 | 15 | 10 | — | — | — | — | Cu | Ti Powder | 6 | Close to Cu foil | AlN | 650° C. | 300 min. | 98.4 |
| Example 26 | 7 | 15 | 10 | — | — | — | — | Cu | Ti Powder | 10 | Close to Cu foil | AlN | 650° C. | 300 min. | 98.7 |
| Example 27 | 7 | 15 | 10 | — | — | — | — | Cu | Ti Powder | 7 | Close to Cu foil | $Si_3N_4$ | 650° C. | 300 min. | 97.1 |
| Example 28 | 7 | 15 | 10 | — | — | — | — | Cu | Ti Powder | 7 | Close to Ceramic Substrate | $Si_3N_4$ | 650° C. | 300 min. | 96.4 |
| Example 29 | 7 | 15 | 10 | — | — | — | — | Cu | $TiH_2$ Powder | 1 | Close to Cu foil | AlN | 650° C. | 300 min. | 99.1 |
| Example 30 | 7 | 15 | 10 | — | — | — | — | Cu | $TiH_2$ Powder | 1 | Close to Ceramic Substrate | AlN | 650° C. | 300 min. | 98.7 |
| Example 31 | 7 | 15 | 10 | — | — | — | — | Cu | $TiH_2$ Powder | 1 | Close to Cu foil | $Si_3N_4$ | 650° C. | 300 min. | 98.8 |
| Example 32 | 7 | 15 | 10 | — | — | — | — | Cu | $TiH_2$ Powder | 1 | Close to Ceramic Substrate | $Si_3N_4$ | 650° C. | 300 min. | 96.1 |

As shown in Tables 1 and 2, in Examples 1 to 32 of the present invention, the ceramic substrate and the Cu foil were bonded to each other with the Cu—P-based brazing filler material and the active metal material being interposed therebetween, and thus it was confirmed that the initial bonding rate between the ceramic substrate and the circuit layer was high, and the ceramic substrate and the circuit layer were sufficiently bonded to each other.

In contrast, in Comparative Example 1, the ceramic substrate and the Cu foil were bonded to each other without the active metal material being interposed therebetween, and thus the ceramic substrate and the Cu foil (circuit layer) could not be bonded to each other.

In Comparative Examples 2 and 3, the P contents of the Cu—P-based brazing filler material were out of the range specified in the present invention, and thus the bonding rate between the ceramic substrate and the circuit layer were lower than those in Examples of the present invention.

Example 2

Hereinafter, results of confirmation tests (Example 2) performed to confirm the effects of the embodiments of the present invention will be described.

Active metal materials (37 mm×37 mm) with thicknesses shown in Tables 3 and 4; sheets of Cu—P-based brazing filler foil (37 mm×37 mm×40 μm thickness); and Cu foils (37 mm×37 mm×0.3 mm thickness) made of oxygen-free copper were laminated on a first surface and a second surface of ceramic substrates (40 mm×40 mm) shown in Tables 3 and 4. When the material of the ceramic substrate was AlN, the thickness of the ceramic substrate was set to 0.635 mm, and when the material was $Si_3N_4$, the thickness was set to 0.32 mm. Similar to Example 1, when the type of the active metal material was powder, a paste containing the active metal powder was applied on the ceramic substrate or the Cu foil by screen-printing, and laminated. The active metal material and the Cu—P-based brazing filler material were disposed as shown in Tables 3 and 4.

While being pressurized at a pressure of 15 kgf/cm² (1.47 MPa) in a laminating direction, the ceramic substrate, and the like, which were laminated, were placed into and heated in a vacuum heating furnace. Thereby, the Cu foils were respectively bonded to the first surface and the second surface of the ceramic substrate, and a circuit layer and a metal layer were formed. The internal pressure of the vacuum heating furnace was set to a range of $10^{-6}$ Pa to $10^{-3}$ Pa, and the heating temperature and the heating time were set to the conditions shown in Tables 3 and 4. When the Cu—P-based brazing filler material contained Zn, the ceramic substrate and the like were heated in a nitrogen atmosphere instead of being heated in the vacuum heating furnace.

As such, the power module substrates in Examples 41 to 60 of the present invention were obtained.

In each of the power module substrates obtained in the aforementioned manner, the initial bonding rate between the circuit layer and the ceramic substrate, and the bonding rate after a thermal cycle test were measured. The number of thermal cycle tests performed until the occurrence of cracking in the ceramic substrate of the power module substrate was measured. In each of the obtained power module substrates in Examples 41 to 49, it was confirmed whether an active metal layer was present at the bonded interface between the circuit layer and the ceramic substrate.

Similar to Example 1, the bonding rate was evaluated, and it was confirmed whether an active metal layer was present. The thermal cycle test was performed as described below.

(Thermal Cycle Test)

One cycle of the thermal cycle test was complete by placing the power module substrate in a liquid phase (Fluorinert) at −40° C. for 5 minutes and 150° C. for 5 minutes using a thermal shock tester TSB-51 manufactured by ESPEC. The thermal cycle tests were performed in 2000 cycles. The power module substrate, in which cracking did not occur in the ceramic substrate even after the thermal cycle tests were performed in 2000 cycles, was denoted by ">2000" in Tables 3 and 4.

Results of the aforementioned evaluations were shown in Tables 3 and 4.

TABLE 3

| | Components of Cu—P-based Brazing Filler Material (mass %) | | | | | | | Type of Active Metal | Thickness of Active Metal Material | Position of Active Metal |
|---|---|---|---|---|---|---|---|---|---|---|
| | P | Sn | Ni | Cr | Fe | Mn | Zn | Balance | Material | μm | Material |
| Example 41 | 7 | 15 | 10 | — | — | — | — | Cu | Ti Foil | 7 | Close to Cu foil |
| Example 42 | 7 | 15 | 10 | — | — | — | — | Cu | Ti Foil | 7 | Close to Ceramic Substrate |
| Example 43 | 3 | — | — | — | — | — | — | Cu | Ti Foil | 10 | Close to Cu foil |
| Example 44 | 10 | — | — | — | — | — | — | Cu | Ti Foil | 10 | Close to Cu foil |
| Example 45 | 7 | 15 | 10 | — | — | — | — | Cu | Zr Foil | 0.5 | Close to Cu foil |
| Example 46 | 7 | 15 | 10 | — | — | — | — | Cu | Nb Foil | 0.5 | Close to Cu foil |
| Example 47 | 7 | 15 | 10 | — | — | — | — | Cu | Hf Foil | 0.5 | Close to Cu foil |
| Example 48 | 7 | 15 | 10 | — | — | — | — | Cu | Ti Foil | 7 | Close to Cu foil |
| Example 49 | 7 | 15 | 10 | — | — | — | — | Cu | Ti Foil | 7 | Close to Ceramic Substrate |

| | Material of Ceramic Substrate | Heating Conditions | | Existence of Active Metal Layer | Initial Bonding Rate % | Bonding Rate After Thermal Cycle % | Cracking in Ceramic Substrate Number of Thermal Cycles |
|---|---|---|---|---|---|---|---|
| | | Temperature | Time | | | | |
| Example 41 | AlN | 650° C. | 180 min. | Yes | 99.7 | 97.9 | >2000 |
| Example 42 | AlN | 650° C. | 180 min. | Yes | 98.5 | 97.0 | >2000 |
| Example 43 | AlN | 1050° C. | 60 min. | No | 98.4 | 97.2 | >2000 |
| Example 44 | AlN | 900° C. | 60 min. | No | 98.3 | 97.4 | >2000 |
| Example 45 | AlN | 650° C. | 180 min. | No | 99.5 | 96.8 | >2000 |
| Example 46 | AlN | 650° C. | 180 min. | No | 98.1 | 97.8 | >2000 |
| Example 47 | AlN | 650° C. | 180 min. | No | 98.3 | 96.5 | >2000 |
| Example 48 | $Si_3N_4$ | 650° C. | 180 min. | Yes | 98.1 | 94.5 | >2000 |
| Example 49 | $Si_3N_4$ | 650° C. | 180 min. | Yes | 97.0 | 93.9 | >2000 |

TABLE 4

| | Components of Cu—P-based Brazing Filler Material (mass %) | | | | | | | Type of Active Metal | Ti Amount or $TiH_2$ Amount | Position of Active Metal |
|---|---|---|---|---|---|---|---|---|---|---|
| | P | Sn | Ni | Cr | Fe | Mn | Zn | Balance | Material | [mg/cm²] | Material |
| Example 50 | 7 | 15 | 10 | — | — | — | — | Cu | Ti Powder | 6 | Close to Cu foil |
| Example 51 | 7 | 15 | 10 | — | — | — | — | Cu | Ti Powder | 6 | Close to Ceramic Substrate |
| Example 52 | 7 | 15 | 10 | — | — | — | — | Cu | Ti Powder | 3 | Close to Cu foil |
| Example 53 | 7 | 15 | 10 | — | — | — | — | Cu | Ti Powder | 5 | Close to Cu foil |
| Example 54 | 7 | 15 | 10 | — | — | — | — | Cu | Ti Powder | 10 | Close to Cu foil |
| Example 55 | 7 | 15 | 10 | — | — | — | — | Cu | Ti Powder | 6 | Close to Cu foil |
| Example 56 | 7 | 15 | 10 | — | — | — | — | Cu | Ti Powder | 6 | Close to Ceramic Substrate |
| Example 57 | 7 | 15 | 10 | — | — | — | — | Cu | $TiH_2$ Powder | 0.5 | Close to Cu foil |
| Example 58 | 7 | 15 | 10 | — | — | — | — | Cu | $TiH_2$ Powder | 0.5 | Close to Ceramic Substrate |
| Example 59 | 7 | 15 | 10 | — | — | — | — | Cu | $TiH_2$ Powder | 0.5 | Close to Cu foil |
| Example 60 | 7 | 15 | 10 | — | — | — | — | Cu | $TiH_2$ Powder | 0.5 | Close to Ceramic Substrate |

TABLE 4-continued

|  | Material of Ceramic Substrate | Heating Conditions | | Initial Bonding Rate % | Bonding Rate After Thermal Cycle % | Cracking in Ceramic Substrate Number of Thermal Cycles |
|---|---|---|---|---|---|---|
|  |  | Temperature | Time |  |  |  |
| Example 50 | AlN | 650° C. | 180 min. | 98.8 | 97.3 | >2000 |
| Example 51 | AlN | 650° C. | 180 min. | 97.6 | 95.2 | >2000 |
| Example 52 | AlN | 650° C. | 180 min. | 98.6 | 96.8 | >2000 |
| Example 53 | AlN | 650° C. | 180 min. | 98.8 | 97.0 | >2000 |
| Example 54 | AlN | 650° C. | 180 min. | 98.4 | 97.4 | >2000 |
| Example 55 | $Si_3N_4$ | 650° C. | 180 min. | 97.9 | 96.5 | >2000 |
| Example 56 | $Si_3N_4$ | 650° C. | 180 min. | 96.5 | 93.4 | >2000 |
| Example 57 | AlN | 650° C. | 180 min. | 99.3 | 96.6 | >2000 |
| Example 58 | AlN | 650° C. | 180 min. | 98.7 | 93.9 | >2000 |
| Example 59 | $Si_3N_4$ | 650° C. | 180 min. | 98.3 | 95.2 | >2000 |
| Example 60 | $Si_3N_4$ | 650° C. | 180 min. | 97.8 | 93.6 | >2000 |

As shown in Tables 3 and 4, in Examples 41 to 60 of the present invention, the ceramic substrate and the Cu foil were bonded to each other with the Cu—P-based brazing filler material and the active metal material being interposed therebetween. Therefore, it was confirmed that the initial bonding rate between the ceramic substrate and the circuit layer was high, and the ceramic substrate and the circuit layer were sufficiently bonded to each other. In Examples 41 to 60 of the present invention, it was confirmed that the bonding rate after the thermal cycle test was high, and the reliability of the bond was high. In Examples 41 to 60 of the present invention, it was confirmed that the number of thermal cycle tests, which were performed until the occurrence of cracking in the ceramic substrate, was large, and cracking was unlikely to occur in the ceramic substrate.

Example 3

Hereinafter, results of confirmation tests (Example 3) performed to confirm the effects of the embodiments of the present invention will be described.

Active metal materials (37 mm×37 mm) with thicknesses and compositions shown in Tables 5 and 6; sheets of Cu—P-based brazing filler foil (37 mm×37 mm×40 μm thickness); and Cu foils (37 mm×37 mm×0.3 mm thickness) made of oxygen-free copper were laminated on first surfaces of ceramic substrates (40 mm×40 mm) shown in Tables 5 and 6. When the material of the ceramic substrate was AlN, the thickness of the ceramic substrate was set to 0.635 mm, and when the material was $Si_3N_4$, the thickness was set to 0.32 mm. An Al plate (37 mm×37 mm×1.6 mm thickness) made of Al with a purity of 99.99% was laminated on a second surface of the ceramic substrate with an Al—Si-based brazing filler material being interposed therebetween. Similar to Example 1, when the type of the active metal material was powder, a paste containing the active metal powder was applied on the ceramic substrate or the Cu foil by screen-printing, and laminated. The active metal material and the Cu—P-based brazing filler material were disposed as shown in Tables 5 and 6.

While being pressurized at a pressure of 15 kgf/cm² (1.47 MPa) in a laminating direction, the ceramic substrate, and the like, which were laminated, were placed into and heated in a vacuum heating furnace. Thereby, the Cu foil was bonded to the first surface of the ceramic substrate, and a circuit layer was formed. The Al plate was bonded to the second surface of the ceramic substrate, and a metal layer was formed. The internal pressure of the vacuum heating furnace was set to a range of $10^{-6}$ Pa to $10^{-3}$ Pa, and the heating temperature and the heating time were set to the conditions shown in Tables 5 and 6. When the Cu—P-based brazing filler material contained Zn, the ceramic substrate and the like were heated in a nitrogen atmosphere instead of being heated in the vacuum heating furnace.

When the temperature of the Cu—P-based brazing filler material exceeded the melting point of the Al plate, the circuit layer was formed on the first surface of the ceramic substrate, and then the metal layer was formed on the second surface of the ceramic substrate.

As such, the power module substrates in Examples 61 to 82 of the present invention were obtained.

In each of the power module substrates obtained in the aforementioned manner, the initial bonding rate between the circuit layer and the ceramic substrate, and the bonding rate after a thermal cycle test were measured. The number of thermal cycle tests performed until the occurrence of cracking in the ceramic substrate of the power module substrate was measured. In each of the power module substrates in Examples 61 to 69, it was confirmed whether an active metal layer was present at the bonded interface between the circuit layer and the ceramic substrate. Similar to Example 2, the bonding rate was evaluated, the thermal cycle test was performed, and it was confirmed whether an active metal layer was present.

Results of the aforementioned evaluations are shown in Tables 5 and 6.

TABLE 5

| | Components of Cu—P-based Brazing Filler Material (mass %) | | | | | | | | Type of Active Metal | Thickness of Active Metal Material | Position of Active Metal |
|---|---|---|---|---|---|---|---|---|---|---|---|
| | P | Sn | Ni | Cr | Fe | Mn | Zn | Balance | Material | μm | Material |
| Example 61 | 7 | 15 | 10 | — | — | — | — | Cu | Ti Foil | 1 | Close to Cu foil |
| Example 62 | 7 | 15 | 10 | — | — | — | — | Cu | Ti Foil | 1 | Close to Ceramic Substrate |
| Example 63 | 3 | — | — | — | — | — | — | Cu | Ti Foil | 9 | Close to Cu foil |

TABLE 5-continued

| | P | Sn | Ni | Cr | Fe | Mn | Zn | Balance | Active Metal Material | Ti Amount or TiH₂ Amount [mg/cm²] | Position of Active Metal |
|---|---|---|---|---|---|---|---|---|---|---|---|
| Example 64 | 10 | — | — | — | — | — | — | Cu | Ti Foil | 9 | Close to Cu foil |
| Example 65 | 7 | 15 | 10 | — | — | — | — | Cu | Zr Foil | 10 | Close to Cu foil |
| Example 66 | 7 | 15 | 10 | — | — | — | — | Cu | Nb Foil | 10 | Close to Cu foil |
| Example 67 | 7 | 15 | 10 | — | — | — | — | Cu | Hf Foil | 10 | Close to Cu foil |
| Example 68 | 7 | 15 | 10 | — | — | — | — | Cu | Ti Foil | 1 | Close to Cu foil |
| Example 69 | 7 | 15 | 10 | — | — | — | — | Cu | Ti Foil | 1 | Close to Ceramic Substrate |

| | Material of Ceramic Substrate | Heating Conditions Temperature | Time | Existence of Active Metal Layer | Initial Bonding Rate % | Bonding Rate After Thermal Cycle % | Cracking in Ceramic Substrate Number of Thermal Cycles |
|---|---|---|---|---|---|---|---|
| Example 61 | AlN | 650° C. | 60 min. | No | 99.0 | 97.4 | >2000 |
| Example 62 | AlN | 650° C. | 60 min. | No | 98.2 | 96.8 | >2000 |
| Example 63 | AlN | 1050° C. | 30 min. | No | 99.2 | 97.4 | >2000 |
| Example 64 | AlN | 950° C. | 30 min. | No | 99.4 | 97.6 | >2000 |
| Example 65 | AlN | 650° C. | 90 min. | Yes | 99.0 | 97.9 | >2000 |
| Example 66 | AlN | 650° C. | 90 min. | Yes | 98.0 | 96.3 | >2000 |
| Example 67 | AlN | 650° C. | 90 min. | Yes | 99.3 | 96.2 | >2000 |
| Example 68 | Si₃N₄ | 650° C. | 60 min. | No | 97.8 | 95.9 | >2000 |
| Example 69 | Si₃N₄ | 650° C. | 60 min. | No | 96.7 | 93.4 | >2000 |

TABLE 6

| | Components of Cu—P-based Brazing Filler Material (mass %) | | | | | | | | Type of Active Metal Material | Ti Amount or TiH₂ Amount [mg/cm²] | Position of Active Metal Material |
|---|---|---|---|---|---|---|---|---|---|---|---|
| | P | Sn | Ni | Cr | Fe | Mn | Zn | Balance | | | |
| Example 70 | 7 | 15 | 10 | — | — | — | — | Cu | Ti Powder | 4 | Close to Cu foil |
| Example 71 | 7 | 15 | 10 | — | — | — | — | Cu | Ti Powder | 4 | Close to Ceramic Substrate |
| Example 72 | 7 | 15 | 10 | — | — | — | — | Cu | Ti Powder | 0.5 | Close to Cu foil |
| Example 73 | 7 | 15 | 10 | — | — | — | — | Cu | Ti Powder | 2 | Close to Cu foil |
| Example 74 | 7 | 15 | 10 | — | — | — | — | Cu | Ti Powder | 7 | Close to Cu foil |
| Example 75 | 7 | 15 | 10 | — | — | — | — | Cu | Ti Powder | 10 | Close to Cu foil |
| Example 76 | 7 | 15 | 10 | — | — | — | — | Cu | Ti Powder | 20 | Close to Cu foil |
| Example 77 | 7 | 15 | 10 | — | — | — | — | Cu | Ti Powder | 4 | Close to Cu foil |
| Example 78 | 7 | 15 | 10 | — | — | — | — | Cu | Ti Powder | 4 | Close to Ceramic Substrate |
| Example 79 | 7 | 15 | 10 | — | — | — | — | Cu | TiH₂ Powder | 2 | Close to Cu foil |
| Example 80 | 7 | 15 | 10 | — | — | — | — | Cu | TiH₂ Powder | 2 | Close to Ceramic Substrate |
| Example 81 | 7 | 15 | 10 | — | — | — | — | Cu | TiH₂ Powder | 2 | Close to Cu foil |
| Example 82 | 7 | 15 | 10 | — | — | — | — | Cu | TiH₂ Powder | 2 | Close to Ceramic Substrate |

| | Material of Ceramic Substrate | Heating Conditions Temperature | Time | Initial Bonding Rate % | Bonding Rate After Thermal Cycle % | Cracking in Ceramic Substrate Number of Thermal Cycles |
|---|---|---|---|---|---|---|
| Example 70 | AlN | 650° C. | 60 min. | 98.8 | 97.0 | >2000 |
| Example 71 | AlN | 650° C. | 60 min. | 97.2 | 95.8 | >2000 |
| Example 72 | AlN | 650° C. | 60 min. | 90.1 | 82.7 | >2000 |
| Example 73 | AlN | 650° C. | 60 min. | 98.2 | 96.7 | >2000 |
| Example 74 | AlN | 650° C. | 60 min. | 98.9 | 97.6 | >2000 |
| Example 75 | AlN | 650° C. | 60 min. | 98.3 | 96.8 | >2000 |
| Example 76 | AlN | 650° C. | 60 min. | 97.4 | 90.3 | 1500-2000 |
| Example 77 | Si₃N₄ | 650° C. | 60 min. | 97.4 | 93.9 | >2000 |
| Example 78 | Si₃N₄ | 650° C. | 60 min. | 96.6 | 90.7 | >2000 |
| Example 79 | AlN | 650° C. | 60 min. | 98.8 | 93.2 | >2000 |
| Example 80 | AlN | 650° C. | 60 min. | 98.2 | 91.9 | 1500-2000 |
| Example 81 | Si₃N₄ | 650° C. | 60 min. | 99.0 | 94.4 | >2000 |
| Example 82 | Si₃N₄ | 650° C. | 60 min. | 98.3 | 92.2 | >2000 |

As shown in Tables 5 and 6, in Examples 61 to 82 of the present invention, the ceramic substrate and the Cu foil were bonded to each other with the Cu—P-based brazing filler material and the active metal material being interposed therebetween. Therefore, it was confirmed that the initial bonding rate between the ceramic substrate and the circuit layer was high, and the ceramic substrate and the circuit layer were sufficiently bonded to each other. In Examples 61 to 82 of the present invention, it was confirmed that the bonding rate after the thermal cycle test was high, and the reliability of the bond was high. In Examples 61 to 82 of the present invention, it was confirmed that the number of thermal cycle tests, which were performed until the occurrence of cracking in the ceramic substrate, was large, and cracking was unlikely to occur in the ceramic substrate.

INDUSTRIAL APPLICABILITY

According to the method of producing the bonded body and the power module substrate of the present invention, the ceramic member and the Cu member can be sufficiently bonded to each other. For this reason, according to the method of producing the bonded body and the power module substrate of the present invention, it is possible to produce a bonded body and a power module substrate suitably used in a power module under severe operating environments, for example, a high-power control power semiconductor element used to control wind power generation systems and electric vehicles such as electric automobiles.

REFERENCE SIGNS LIST

10, 110, 210: POWER MODULE SUBSTRATE (BONDED BODY)
11: CERAMIC SUBSTRATE (CERAMIC MEMBER)
12, 112, 212: CIRCUIT LAYER (Cu MEMBER)
113, 213: METAL LAYER (Cu MEMBER)
25, 125: Ti FOIL (ACTIVE METAL MATERIAL, Ti MATERIAL)

The invention claimed is:

1. A method of producing a bonded body in which a ceramic member made of ceramics and a Cu member made of Cu or a Cu alloy are bonded to each other, the method comprising:
a laminating step of laminating the ceramic member and the Cu member in a state where a layer of a Cu—P-based brazing filler material containing 3 mass % to 10 mass % of P and a layer of an active metal material are interposed between the Cu member and the ceramic member; and
a heating step of heating the ceramic member and the Cu member which are laminated while pressurizing the ceramic member and the Cu member which are laminated in a laminating direction at a pressure of 1 kgf/cm$^2$ to 35 kgf/cm$^2$, wherein
in the laminating step, the Cu—P-based brazing filler material is disposed directly adjacent to the ceramic member, and the active metal material is disposed directly adjacent to the Cu member.

2. The method of producing a bonded body according to claim 1,
wherein the Cu—P-based brazing filler material is any one selected from a Cu—P brazing filler material, a Cu—P—Sn brazing filler material, a Cu—P—Sn—Ni brazing filler material, and a Cu—P—Zn brazing filler material.

3. The method of producing a bonded body according to claim 1,
wherein the active metal material contains Ti.

4. A method of producing a power module substrate in which a circuit layer made of Cu or a Cu alloy is provided on a first surface of a ceramic substrate,
wherein the ceramic substrate and the circuit layer are bonded to each other by the method of producing a bonded body according to claim 1.

5. A method of producing a power module substrate in which a circuit layer made of Cu or a Cu alloy is provided on a first surface of a ceramic substrate, and a metal layer made of Cu or a Cu alloy is provided on a second surface of the ceramic substrate,
wherein the ceramic substrate and the circuit layer are bonded to each other, and the ceramic substrate and the metal layer are bonded to each other by the method of producing a bonded body according to claim 1.

6. A method of producing a power module substrate in which a circuit layer made of Cu or a Cu alloy is provided on a first surface of a ceramic substrate, and a metal layer made of Al or an Al alloy is provided on a second surface of the ceramic substrate,
wherein the ceramic substrate and the circuit layer are bonded to each other by the method of producing a bonded body according to claim 1.

7. The method of producing a bonded body according to claim 1,
wherein the Cu—P-based brazing filler material is any one selected from a Cu—P brazing filler material, a Cu—P—Sn brazing filler material, a Cu—P—Sn—Ni brazing filler material, and a Cu—P—Zn brazing filler material.

8. The method of producing a bonded body according to claim 1,
wherein the active metal material contains Ti.

9. The method of producing a bonded body according to claim 2,
wherein the active metal material contains Ti.

10. The method of producing a bonded body according to claim 7,
wherein the active metal material contains Ti.

11. A method of producing a power module substrate in which a circuit layer made of Cu or a Cu alloy is provided on a first surface of a ceramic substrate,
wherein the ceramic substrate and the circuit layer are bonded to each other by the method of producing a bonded body according to claim 1.

12. A method of producing a power module substrate in which a circuit layer made of Cu or a Cu alloy is provided on a first surface of a ceramic substrate,
wherein the ceramic substrate and the circuit layer are bonded to each other by the method of producing a bonded body according to claim 2.

13. A method of producing a power module substrate in which a circuit layer made of Cu or a Cu alloy is provided on a first surface of a ceramic substrate,
wherein the ceramic substrate and the circuit layer are bonded to each other by the method of producing a bonded body according to claim 3.

14. A method of producing a power module substrate in which a circuit layer made of Cu or a Cu alloy is provided on a first surface of a ceramic substrate, and a metal layer made of Cu or a Cu alloy is provided on a second surface of the ceramic substrate,
wherein the ceramic substrate and the circuit layer are bonded to each other, and the ceramic substrate and the metal layer are bonded to each other by the method of producing a bonded body according to claim 1.

15. A method of producing a power module substrate in which a circuit layer made of Cu or a Cu alloy is provided on a first surface of a ceramic substrate, and a metal layer made of Cu or a Cu alloy is provided on a second surface of the ceramic substrate, wherein the ceramic substrate and the circuit layer are bonded to each other, and the ceramic substrate and the metal layer are bonded to each other by the method of producing a bonded body according to claim 2.

16. A method of producing a power module substrate in which a circuit layer made of Cu or a Cu alloy is provided on a first surface of a ceramic substrate, and a metal layer made of Cu or a Cu alloy is provided on a second surface of the ceramic substrate, wherein the ceramic substrate and the circuit layer are bonded to each other, and the ceramic substrate and the metal layer are bonded to each other by the method of producing a bonded body according to claim 3.

17. A method of producing a power module substrate in which a circuit layer made of Cu or a Cu alloy is provided on a first surface of a ceramic substrate, and a metal layer made of Al or an Al alloy is provided on a second surface of the ceramic substrate, wherein the ceramic substrate and the circuit layer are bonded to each other by the method of producing a bonded body according to claim 1.

18. A method of producing a power module substrate in which a circuit layer made of Cu or a Cu alloy is provided on a first surface of a ceramic substrate, and a metal layer made of Al or an Al alloy is provided on a second surface of the ceramic substrate, wherein the ceramic substrate and the circuit layer are bonded to each other by the method of producing a bonded body according to claim 2.

19. A method of producing a power module substrate in which a circuit layer made of Cu or a Cu alloy is provided on a first surface of a ceramic substrate, and a metal layer made of Al or an Al alloy is provided on a second surface of the ceramic substrate, wherein the ceramic substrate and the circuit layer are bonded to each other by the method of producing a bonded body according to claim 3.

* * * * *